United States Patent
Kuboyama et al.

(10) Patent No.: US 7,504,850 B2
(45) Date of Patent: Mar. 17, 2009

(54) SINGLE-EVENT-EFFECT TOLERANT SOI-BASED INVERTER, NAND ELEMENT, NOR ELEMENT, SEMICONDUCTOR MEMORY DEVICE AND DATA LATCH CIRCUIT

(75) Inventors: Satoshi Kuboyama, Tsukuba (JP); Hiroyuki Shindou, Tsukuba (JP); Yoshiya Iide, Tsukuba (JP); Akiko Makihara, Tsukuba (JP)

(73) Assignees: Japan Aerospace Exploration Agency, Tokyo (JP); High-Reliability Engineering & Components Corporation, Ibaraki (JP)

( * ) Notice: Subject to any disclaimer, the term of this patent is extended or adjusted under 35 U.S.C. 154(b) by 17 days.

(21) Appl. No.: 11/499,498

(22) Filed: Aug. 3, 2006

(65) Prior Publication Data

US 2007/0069305 A1    Mar. 29, 2007

Related U.S. Application Data

(63) Continuation of application No. PCT/JP2005/001675, filed on Feb. 4, 2005.

(30) Foreign Application Priority Data

Feb. 4, 2004 (JP) ............................. 2004-027818

(51) Int. Cl.
    *H03K 19/003* (2006.01)
(52) U.S. Cl. ................................ 326/9; 326/10; 326/13; 326/104
(58) Field of Classification Search ............... 326/9–10, 326/12–15

See application file for complete search history.

(56) References Cited

U.S. PATENT DOCUMENTS

| 5,175,605 A | 12/1992 | Pavlu et al. |
| 6,278,287 B1 * | 8/2001 | Baze ............................. 326/9 |
| 2002/0017924 A1 | 2/2002 | Knowles |
| 2002/0063583 A1 | 5/2002 | Eaton |
| 2004/0007743 A1 | 1/2004 | Matsuda et al. |

FOREIGN PATENT DOCUMENTS

| EP | 1 387 494 A1 | 2/2004 |
| JP | 61-206998 | 9/1986 |
| JP | 2000-101420 | 4/2000 |
| JP | 2002-200130 | 7/2002 |
| JP | 2004-48170 A | 2/2004 |

OTHER PUBLICATIONS

European Search Report, European Application No. 05709741.2; mailing date, Jul. 23, 2007 (3 pp.).

* cited by examiner

*Primary Examiner*—Anh Q Tran
(74) *Attorney, Agent, or Firm*—Blakely, Sokoloff, Taylor & Zafman LLP

(57) ABSTRACT

Disclosed is an inverter, a NAND element, a NOR element, a memory element and a data latch circuit which exhibit high tolerance to single event effect (SEE). In an SEE tolerant inverter (3I), each of a p-channel MOS transistor and a n-channel MOS transistor which form an inverter is connected in series with an additional second transistor of the same conductive type as that thereof so as to form a double structure (3P1, 3P2; 3N1, 3N2). Further, a node A between the two p-channel MOS transistors and a node (B) between the two n-channel MOS transistors are connected together through a connection line. Each of an SEE tolerant memory element and an SEE tolerant data latch circuit comprises this SEE tolerant inverter (3I).

14 Claims, 16 Drawing Sheets

US 7,504,850 B2

SINGLE-EVENT-EFFECT TOLERANT SOI-BASED INVERTER, NAND ELEMENT, NOR ELEMENT, SEMICONDUCTOR MEMORY DEVICE AND DATA LATCH CIRCUIT

CROSS-REFERENCE TO RELATED APPLICATIONS

This is a continuation of prior International Patent Application No. PCT/JP2005/001675, filed on Feb. 4, 2005, which claims priority from Japanese Patent Application No. 2004-27818, filed on Feb. 4, 2004, each of which is incorporated herein by reference in its entirety.

TECHNICAL FIELD

The present invention relates to an SOI (Silicon-On-Insulator)-based inverter, an SOI-based memory device and an SOI-based data latch circuit, and more specifically to SEE (Single Event Effect)-tolerant SOI-based inverter, an SEE-tolerant SOI-based memory device and an SEE-tolerant SOI-based data latch circuit. The present invention further relates to an SOI-based NAND element and an SOI-based NOR element, and more specifically to an SEE-tolerant SOI-based NAND element and an SEE-tolerant SOI-based NOR element.

BACKGROUND ART

A semiconductor device, such as a memory device or a data latch circuit, has a storage node consisting of a combination of two inverters. If high-energy particle beams, such as energetic radiations or ions, strike a conventional inverter in operation, the energetic particles are likely to leave behind electron-hole pairs in elements of the inverter, or generate electric charges, as a result of their actions on the elements, such as ionization and excitation. The generated electric charges may cause the so-called "single-event transient phenomenon" that they flow in various regions of the inverter according to electric fields in the elements, and the occurrence of such phenomenon leads to malfunctions of the elements, for example, transiently flipping or inverting an output of the inverter. The phenomenon occurring in an inverter constituting a memory device is likely to cause a serious malfunction or inversion of stored information. This effect is referred to as "single event effect (SEE) (in this case, single event upset (SEU))". SEE is often observed in environments with a high possibility of the presence of high-energy particles, such as high altitude, cosmic space and radiation-related facilities, and regarded as one factor obstructive to a normal operation of a computer under such environments. While it is contemplated to fully shield the high-energy particles in a physical or mechanical manner so as to prevent SEE, such an approach is not realistic. As practical and effective measures against SEE, it is necessary to develop an inverter or memory device with a structure tolerant to SEE by itself.

FIG. 1 is a circuit diagram showing a conventional inverter 1I1. As used in this specification, reference codes are defined as follows:
  D: input data signal;
  G: input clock signal;
  Gi: clock signal (in-phased relative to the input clock signal G);
  GBi: inverted clock signal;
  Q: output data signal;
  XQ: inverted output data signal;
  $V_{DD}$: source voltage from first voltage source; and
  $V_{SS}$: source voltage [0 (zero) V] from second voltage source.

The inverter 1I1 comprises a p-channel MOS transistor 1P1 and a n-channel MOS transistor 1N1, which are connected in series with respect to a source or drain line in this order in a direction from a node connected to the side of a first voltage source ($V_{DD}$) to a node connected to the side of a second voltage source ($V_{SS}$). When SEE occurs, either one of the transistors which is in an OFF state, for example, the p-channel MOS transistor 1P1 which is receiving a clock signal G having a high level, is momentarily changed from the OFF state to an ON state, so that an inverted clock signal GBi which is being output at a low level is momentarily shifted to a high level.

FIG. 2 is a circuit diagram showing a data latch circuit 1 using a conventional inverter. In order to produce an inverted clock signal GBi to be input into the data latch circuit 1, the inverter 1I1 illustrated in FIG. 1 is used in combination therewith. In the data latch circuit 1, when a clock signal G has a low level, an output data signal Q is generated at the same logic level as that of an input data signal D (transparent mode or through mode). At a rise timing of the clock signal G, an input data signal D is received from a clocked inverter 1I2 in an input stage, and latched. The latched data will be held during a period where the clock signal G has a high level (latch mode). Specifically, the latched data is held by a storage node consisting of a clocked inverter 1I3 and an inverter 1I4 which are cross-connected between respective outputs and inputs thereof. An output data signal Q and an inverted output data signal XQ are output, respectively, from an inverter 1I5 and an inverter 1I6 which serve as a buffer circuit. As one example, given that, during the latch mode, either one of the clocked inverter 1I3 and the inverter 1I4 which serve as a storage node is changed from an OFF state to an ON state due to SEE. In this case, an output of the affected inverter including transistors is shifted to an opposite logic level, and this change in logic value is input into the other inverter to invert its output. Consequently, a logic value in the storage node is inverted, resulting in occurrence of SEE. As another example, given that either one of a transistor 1P3 and a transistor 1N3 of the clocked inverter 1I2 in the input stage, each of which is set in an OFF state during the latch mode to prevent any input data signal D from being transmitted to subsequent stages, is changed to an ON state due to SEE. In this case, an input data signal D will be output to the subsequent stages (in an inverted state). Then, if the input data signal D has a logic level opposite to a logic state stored on the storage node, stored data will be inverted (the SEU occurs). As above, the conventional inverter and the conventional memory device including such an inverter are extremely susceptible to SEE.

A conventional element for a fundamental logic circuit is also susceptible to SEE. FIG. 9 is a circuit diagram showing a conventional 2-input NAND element, and FIG. 10 is a circuit diagram showing a conventional 3-input NAND element. FIG. 11 is a circuit diagram showing a conventional 2-input NOR element, and FIG. 12 is a circuit diagram showing a conventional 3-input NOR element. In each circuit of these elements, if a transistor in an OFF state is changed to an ON state due to SEE, an output of the transistor is likely to be largely changed to the opposite logic level. Thus, in an element receiving an output from the malfunctioning element, a logic value of the input can be inverted (single event transient (SET) as one cause of SEE occurs).

Heretofore, there has been known the following inverter and memory device with a structure tolerant to the above SEE

[a technique disclosed in Japanese Patent Application No. 2002-200130 (JP 2004-048170 A1)]. FIG. 3 is a circuit diagram showing an inverter 2I with a redundant or double structure. Specifically, in the inverter 2I, a first p-channel MOS transistor 2P1 and a first n-channel MOS transistor 2N1 are connected in series with respect to a source or drain line in this order in a direction from a node connected to the side of a first voltage source to a node connected to the side of a second voltage source. Further, a second p-channel MOS transistor 2P2 and a second n-channel MOS transistor 2N2 are connected, respectively, to the first p-channel MOS transistor 2P1 and the first n-channel MOS transistor 2N1 through respective gates thereof, and connected in series with respect to the source or drain line, to form a double structure.

Based on the following operation, the above inverter 2I can suppress SEE to some extent. When a clock signal G has a high level, each of the transistors 2P1, 2P2 is in an OFF state, and each of the transistors 2N1, 2N2 is in an ON state. Further, an inverted clock signal GBi, or output, has a low level. Given that either one of the transistors 2P1, 2P2 in the OFF state is changed to an ON state due to SEE caused by incident high-energy particles. In this case, the remaining one of the other transistors 2P1, 2P2 connected in series with respect to the source or drain is maintained in the OFF state. Thus, a change in output level due to SEE is blocked by the transistor in the OFF state, and an output or an inverted clock signal GBi is free of the influence thereof. In this way, even if either one of the transistors has malfunction as described above, the inverter will be less subject to SEE in its entirely. This inverter can be used to form a memory device or data latch circuit having some level of SEE tolerance.

DISCLOSURE OF THE INVENTION

Considering deleterious effects of SEE, and it is desirable to further improve the current level of tolerance to SEE. Thus, there is the need for an inverter, a memory device and a data latch circuit which have a higher level of SEE tolerance.

In view of the above circumstances, it is an object of the present invention to provide an inverter, a memory device and a data latch circuit which have a higher level of SEE tolerance. This object is achieved by the present invention having the following features. As set forth in the appended claim 1, according to the first aspect of the present invention, there is provided an SEE tolerant SOI-based inverter comprising a first p-channel MOS transistor and a first n-channel MOS transistor, which are formed on a substrate having an SOI structure, and connected in series with respect to a source or drain line in this order in a direction from a node connected to the side of a first voltage source to a node connected to the side of a second voltage source. In this inverter, each of the first p-channel MOS transistor and the first n-channel MOS transistor is combined with a second MOS transistor having a channel of the same conductive type as that thereof and a gate interconnected to a gate thereof, in such a manner that they are connected in series with respect to the source or drain line, and respective nodes between the first and second p-channel MOS transistors and between the first and second n-channel MOS transistors are connected together, so as to formed a double structure.

As set forth in the appended claim 2, according to a second aspect of the present invention, there is provided an SEE tolerant SOI-based inverter comprising a first p-channel MOS transistor, a second p-channel MOS transistor, a first n-channel MOS transistor and a second n-channel MOS transistor, which are formed on a substrate having an SOI structure, and connected in series with respect to a source or drain line in this order in a direction from a node connected to the side of a first voltage source to a node connected to the side of a second voltage source. In this inverter, the first p-channel MOS transistor, the second p-channel MOS transistor, the first n-channel MOS transistor and the second n-channel MOS transistor are arranged to form an inverter circuit. Further, respective gates of the first p-channel MOS transistor, the second p-channel MOS transistor, the first n-channel MOS transistor and the second n-channel MOS transistor are connected to a common node so as to be connected to an input of the inverter circuit, and respective nodes between the first and second p-channel MOS transistors and between the first and second n-channel MOS transistor are connected together, whereby the first and second p-channel MOS transistors are formed as a double-structured p-channel MOS transistor, and the first and second n-channel MOS transistors are formed as a double-structured n-channel MOS transistor.

As set forth in the appended claim 3, according to a third aspect of the present invention, there is provided an SEE tolerant SOI-based semiconductor memory device which is formed on a substrate having an SOI structure and including two inverters having respective outputs cross-connected to respective inputs thereof directly or indirectly through a switching gate. In this semiconductor memory device, at least one of the inverters consists of the SEE tolerant SOI-based inverter set forth in the first or second aspect of the present invention.

As set forth in the appended claim 4, according to a fourth aspect of the present invention, there is provided an SEE tolerant SOI-based data latch circuit which is formed on a substrate having an SOI structure and including a first inverter, a second inverter and a clocked inverter. The first inverter has an output connected to an input of the second inverter. The second inverter has an output connected to an input of the first inverter through a connection to be subject to on-off control based on first complementary clock signals having logic values complementary to each other. The clocked inverter is operable to invert an received input and output the inverted input to the input of the first inverter under on-off control based on second complementary clock signals opposite in phase relative to the first complementary clock signals. In this data latch circuit, at least one of the first and second inverters consists of the SEE tolerant SOI-based inverter set forth in the first or second aspect of the present invention.

As set forth in the appended claim 5, in the fourth aspect of the present invention, the clocked inverter includes a first p-channel MOS transistor, a second p-channel MOS transistor, a third p-channel MOS transistor, a first n-channel MOS transistor, a second n-channel MOS transistor and a third n-channel MOS transistor, which are connected in series with respect to a source or drain line in this order in a direction from a node connected to the side of the first voltage source to a node connected to the side of the second voltage source. Further, the second complementary clock signals are applied, respectively, to a first gate group consisting of respective gates of the first and third p-channel MOS transistors, and a second gate group consisting of the first and third n-channel MOS transistors. Each of the second p-channel MOS transistor and the second n-channel MOS transistor serves as an input section of this data latch circuit, and a node between the third p-channel MOS transistor and the first n-channel MOS transistor serves as an output section of the clocked inverter.

As set forth in the appended claim 6, according to a fifth aspect of the present invention, there is provided an SEE tolerant SOI-based 2-input NAND element comprising a pair of a first p-channel MOS transistor and a second p-channel MOS transistor which have channels connected in parallel with each other, and a pair of a first n-channel MOS transistor and a second n-channel MOS transistor which have channels connected in series with each other. The p-channel MOS transistor pair and the n-channel MOS transistor pair are formed on a substrate having an SOI structure, and connected in series in a direction from a node connected to the side of a first voltage source to a node connected to the side of a second voltage source. Further, respective gates of the first p-channel MOS transistor and the first n-channel MOS transistor are connected to a first input, and respective gates of the second p-channel MOS transistor and the second n-channel MOS transistor are connected to a second input. A node between the p-channel MOS transistor pair and the n-channel MOS transistor pair is connected to an output. In this 2-input NAND element, each of the first p-channel MOS transistor, the second p-channel MOS transistor, the first n-channel MOS transistor and the second n-channel MOS transistor, is combined with an additional MOS transistor having a channel of the same conductive type as that thereof and a gate interconnected to a gate thereof, in such a manner that their channels are connected in series, so as to form a double structure.

As set forth in the appended claim 7, in the fifth aspect of the present invention, the two additional n-channel MOS transistor combined, respectively, with the first n-channel MOS transistor and the second n-channel MOS transistor through their series-connected channels for forming the double structure, are connected thereto except for a position between the first and second n-channel MOS transistors.

As set forth in the appended claim 8, according to a sixth aspect of the present invention, there is provided an SEE tolerant SOI-based 3-input NAND element comprising a group of a first p-channel MOS transistor, a second p-channel MOS transistor and a third p-channel MOS transistor which have channels connected in parallel with each other, and a group of a first n-channel MOS transistor a second n-channel MOS transistor and a third n-channel MOS transistor which have channels connected in series with each other. The p-channel MOS transistor group and the n-channel MOS transistor group are formed on a substrate having an SOI structure, and connected in series in a direction from a node connected to the side of a first voltage source to a node connected to the side of a second voltage source. Further, respective gates of the first p-channel MOS transistor and the first n-channel MOS transistor are connected to a first input, and respective gates of the second p-channel MOS transistor and the second n-channel MOS transistor are connected to a second input. Respective gates of the third p-channel MOS transistor and the third n-channel MOS transistor are connected to a third input, and a node between the p-channel MOS transistor group and the n-channel MOS transistor group is connected to an output. In this 3-input NAND element, each of the first p-channel MOS transistor, the second p-channel MOS transistor, the third p-channel MOS transistor, the first n-channel MOS transistor, the second n-channel MOS transistor and the third n-channel MOS transistor, is combined with an additional MOS transistor having a channel of the same conductive type as that thereof and a gate interconnected to a gate thereof, in such a manner that their channels are connected in series, so as to form a double structure.

As set forth in the appended claim 9, in the sixth aspect of the present invention, the three additional n-channel MOS transistor combined, respectively, with the first n-channel MOS transistor, the second n-channel MOS transistor and the third n-channel MOS transistor through their series-connected channels for forming the double structure, are connected thereto except for a position between any two of the first, second and third n-channel MOS transistors.

As set forth in the appended claim 10, according to a seventh aspect of the present invention, there is provided an SEE tolerant SOI-based 2-input NOR element comprising: a pair of a first p-channel MOS transistor and a second p-channel MOS transistor which have channels connected in series with each other; and a pair of a first n-channel MOS transistor and a second n-channel MOS transistor which have channels connected in parallel with each other. The p-channel MOS transistor pair and the n-channel MOS transistor pair are formed on a substrate having an SOI structure, and connected in series in a direction from a node connected to the side of a first voltage source to a node connected to the side of a second voltage source. Further, respective gates of the first p-channel MOS transistor and the first n-channel MOS transistor are connected to a first input, and respective gates of the second p-channel MOS transistor and the second n-channel MOS transistor are connected to a second input. A node between the p-channel MOS transistor pair and the n-channel MOS transistor pair is connected to an output. In this 2-input NOR element, each of the first p-channel MOS transistor, the second p-channel MOS transistor, the first n-channel MOS transistor and the second n-channel MOS transistor, is combined with an additional MOS transistor having a channel of the same conductive type as that thereof and a gate interconnected to a gate thereof, in such a manner that their channels are connected in series, so as to form a double structure.

As set forth in the appended claim 11, in the seventh aspect of the present invention, the two additional p-channel MOS transistor combined, respectively, with the first p-channel MOS transistor and the second p-channel MOS transistor through their series-connected channels for forming the double structure, are connected thereto except for a position between the first and second p-channel MOS transistors.

As set forth in the appended claim 12, according to an eighth aspect of the present invention, there is provided an SEE tolerant SOI-based 3-input NOR element comprising: a group of a first p-channel MOS transistor, a second p-channel MOS transistor and a third p-channel MOS transistor which have channels connected in series with each other; and a group of a first n-channel MOS transistor, a second n-channel MOS transistor and a third n-channel MOS transistor which have channels connected in parallel with each other. The p-channel MOS transistor group and the n-channel MOS transistor group are formed on a substrate having an SOI structure, and connected in series in a direction from a node connected to the side of a first voltage source to a node connected to the side of a second voltage source. Further, respective gates of the first p-channel MOS transistor and the first n-channel MOS transistor are connected to a first input, and respective gates of the second p-channel MOS transistor and the second n-channel MOS transistor are connected to a second input. Respective gates of the third p-channel MOS transistor and the third n-channel MOS transistor are connected to a third input, and a node between the p-channel MOS transistor group and the n-channel MOS transistor group is connected to an output. In this 3-input NOR element, each of the first p-channel MOS transistor, the second p-channel MOS transistor, the third p-channel MOS transistor, the first n-channel MOS transistor, the second n-channel MOS transistor and the third n-channel MOS transistor, is combined with an additional MOS transistor having a channel of the same conductive type as that thereof and a gate interconnected to a gate thereof, in such a manner that their channels are connected in series, so as to form a double structure.

As set forth in the appended claim 13, in the eighth aspect of the present invention, the three additional p-channel MOS transistor combined, respectively, with the first p-channel MOS transistor, the second p-channel MOS transistor and the third p-channel MOS transistor through their series-connected channels for forming the double structure, are connected thereto except for a position between any two of the first, second and third p-channel MOS transistors.

As above, in the present invention, each of the p-channel MOS transistors and the n-channel MOS transistor of the inverter is connected in series with an additional MOS transistor having a channel of the same conductive type as that thereof, to formed a double structure, and respective nodes between the two p-channel MOS transistors and between the two n-channel MOS transistors are connected together through a connection line. Thus, the single event transient (SET) becomes less likely to occur, because a potential difference between the source and drain in each of the two MOS transistors between two lines connected to the connection line becomes approximately zero. Even if one of the remaining MOS transistors is turned on from its OFF state due to the SET, an inverter output becomes less affected thereby. This makes it possible to obtain an effect of being able to provide an SEE tolerant inverter capable of effectively preventing the occurrence of a malfunction due to SEE.

In the present invention, a memory element includes a storage node comprising two of the SEE tolerant inverters having respective outputs cross-connected to respective inputs thereof. This makes it possible to obtain an effect of being able to provide an SEE tolerant memory element capable of effectively preventing the occurrence of a malfunction due to SEE.

In the present invention, a data latch circuit includes a storage node comprising two of the SEE tolerant inverters, and one additional MOS transistor is connected in series with each of a p-channel MOS transistor and a n-channel MOS transistor included in a clocked inverter in a data input stage and connected to a clock. This makes it possible to obtain an effect of being able to provide an SEE tolerant data latch circuit capable of effectively preventing the occurrence of a malfunction due to SEE.

In the present invention, each of two or three p-channel MOS transistors and two or three n-channel MOS transistors in either one of a 2-input NAND element, 3-input NAND element, 2-input NOR element and 3-input NOR element, is combined with an additional MOS transistor having a channel of the same conductive type as that thereof and a gate interconnected to a gate thereof, in such a manner that their channels are connected in series, so as to form a double structure. This makes it possible to obtain an effect of being able to provide a 2-input NAND element, a 3-input NAND element, 2-input NOR element and 3-input NOR element each capable of effectively preventing the occurrence of a malfunction due to SEE.

BEST MODE FOR CARRYING OUT THE INVENTION (Configuration of Inverter According to First Embodiment of the Present Invention)

Figure 1:
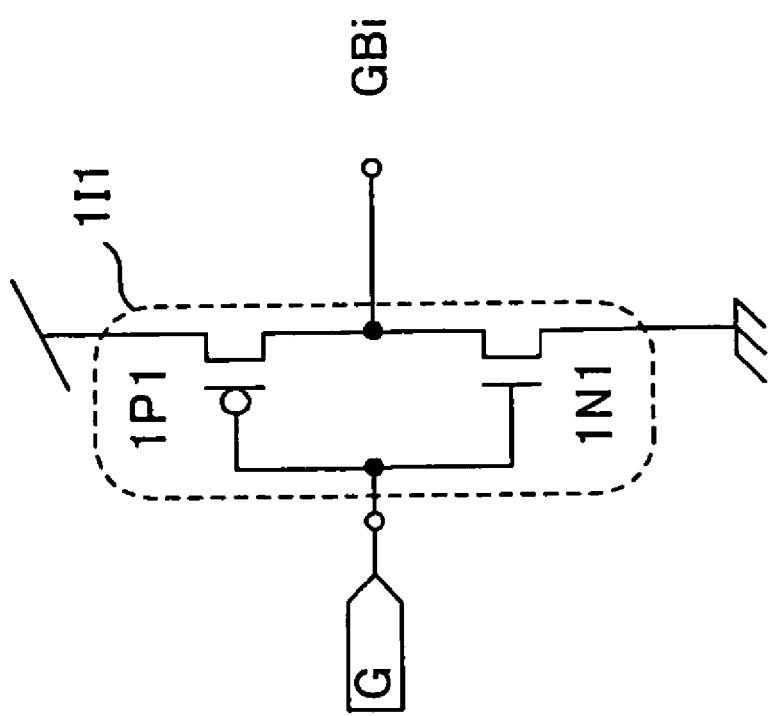
FIG. 1 is a circuit diagram showing the configuration of a conventional inverter 1I1.
Figure 2:
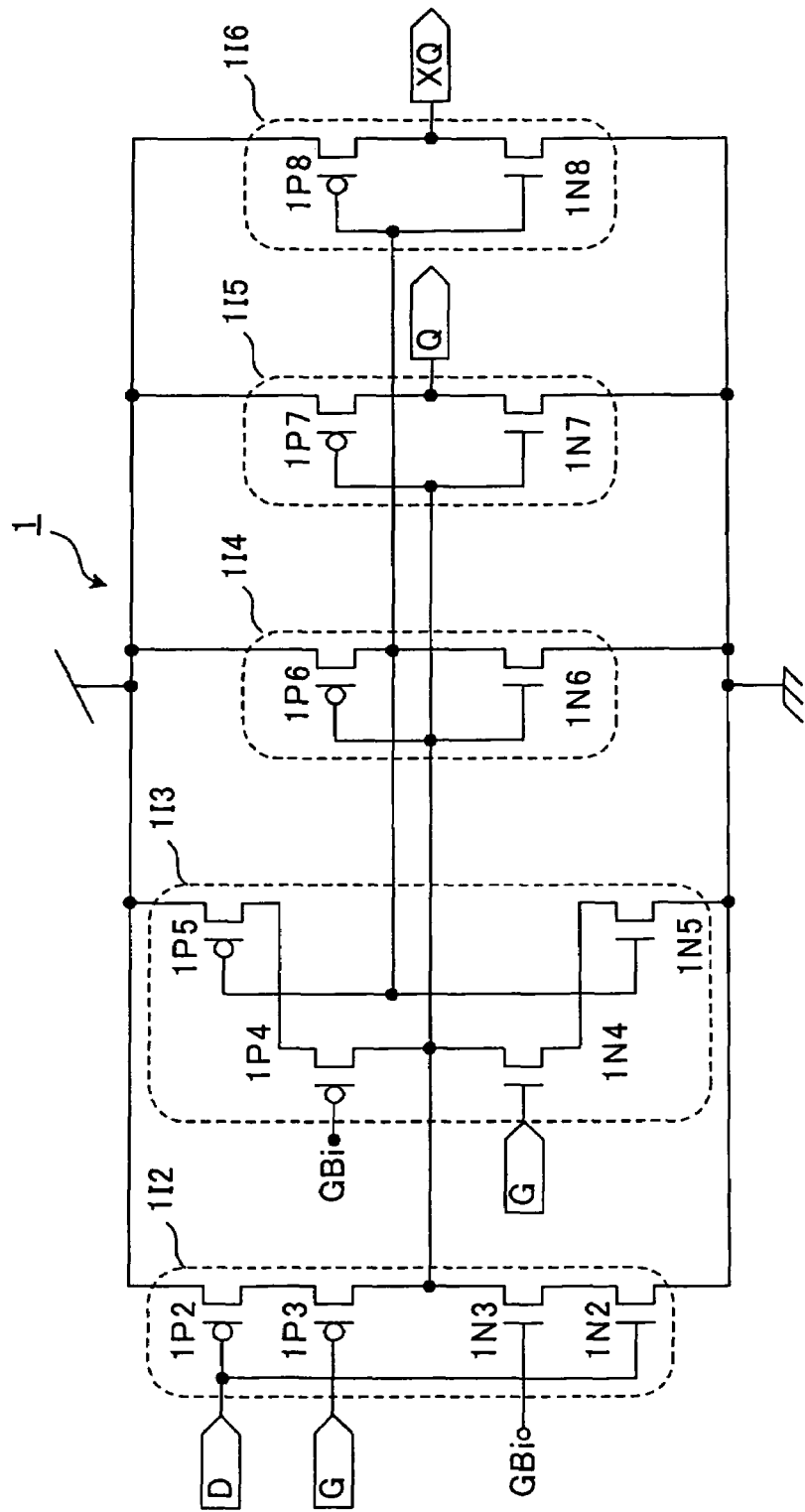
FIG. 2 is a circuit diagram showing the configuration of a conventional data latch circuit I.
Figure 3:
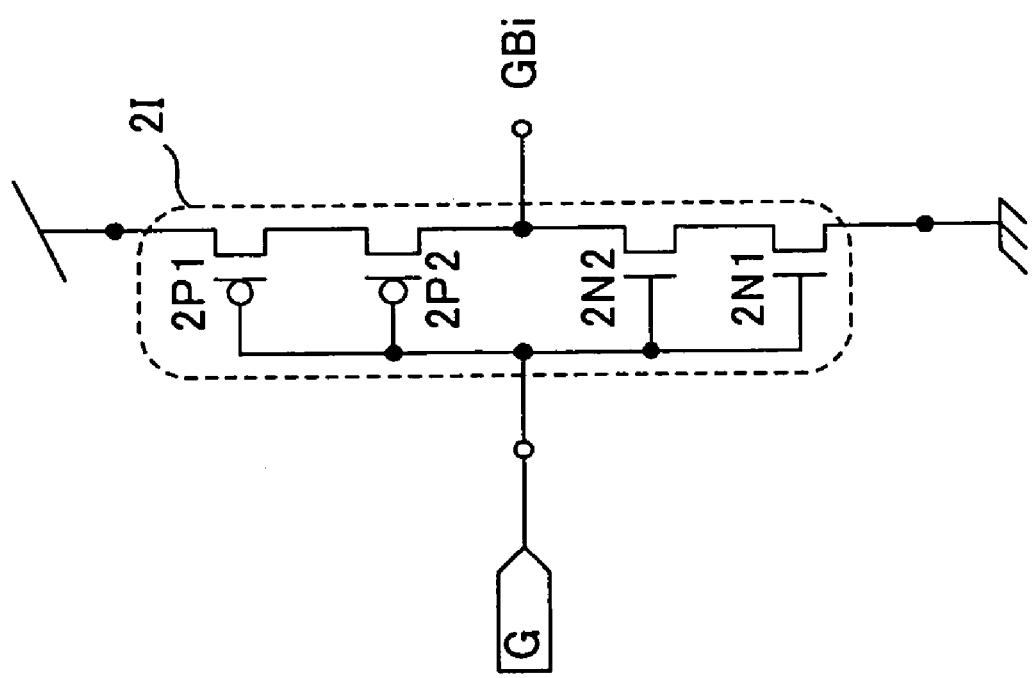
FIG. 3 is a circuit diagram showing the configuration of a conventional inverter 2I including a double-structured transistor.
Figure 4:
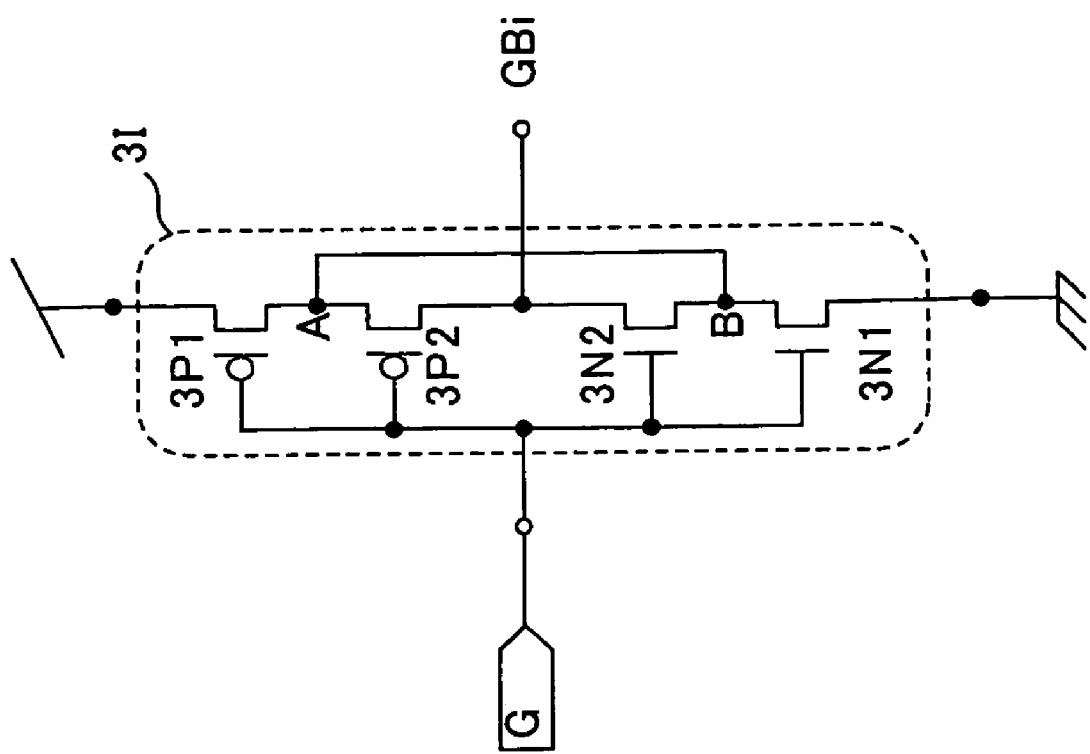
FIG. 4 is a circuit diagram showing the configuration of an SEE tolerant inverter 3I according to a first embodiment of the present invention.

With reference to the circuit diagrams (FIGS. 4 to 6), respective configurations and operations of an inverter and a data latch circuit according to one embodiment of the present invention will now be described. FIG. 4 is a diagram showing the configuration of an inverter 3I including a double-structured transistor, according to a first embodiment of the present invention. In the inverter 3I, a (p-channel MOS) transistor 3P1 corresponding to the transistor 1P1 in the inverter 1I1 is combined with a (p-channel MOS) transistor 3P2 having a channel of the same conductive type as that thereof (p-channel MOS) and a gate connected to a gate thereof, in such a manner that they are connected in series with respect to a source or drain line, so as to form a double structure. The two transistors 3P1, 3P2 have a common gate, and their source or drain line to be controlled by the gate are connected in series with each other. Thus, the two transistors have the same operation as that of a single transistor. In the same manner, an (n-channel MOS) transistor 3N2 is additionally connected in series to an (n-channel MOS) transistor 3N1 with respect to the source or drain line. In the inverter 3I, respective nodes between the transistor 3P1 and the transistor 3P2 (node A in FIG. 4) and between the transistor 3N1 and the transistor 3N2 (node B in FIG. 4), and thereby a potential difference between the nodes A, B is approximately zero. This connection between the nodes A, B will hereinafter be referred to as "AB short line". A connection point (downward-sloping slant line in FIG. 4) from a first voltage supply having a voltage supply voltage $V_{DD}$ is connected to the transistor 3P1, and a connection point (downward-sloping slant line in FIG. 4) from a second voltage supply having a voltage supply voltage Vss (symbol of Chassis Ground) is connected to the transistor 3N1. Preferably, Vss is set at 0 (zero) V.

(Operation of Inverter According to First Embodiment of the Present Invention)

With reference to FIG. 4, the operation of the inverter 3I according to the first embodiment will be described below. Firstly, the operation will be described under the condition that a clock signal G is in a high level. In the inverter 3I under this condition, the transistors 3P1 and transistor 3P2 are in their OFF state, and the transistors 3N1 and transistor 3N2 are in their ON state. Thus, an inverted clock signal GBi has a low level. In this state, due to the short line AB, the node A is in a low level, and a potential difference between the source and drain of the transistor 3P2 becomes approximately zero. It has been proven that the inverter 3I can effectively prevent SEE. It is believed that this effect is obtained from the following mechanism. Fundamentally, SEE occurs when a transistor in its OFF state is turned on due to SEE. That is, SEE is likely to occur in the transistors 3P1, 3P2 in the OFF state. However, the transistor 3P2 includes approximately no region with a strong electric field therein, because of approximately zero potential difference between the source and drain thereof, as described above. Thus, even if electric charges are generated by high-energy particles, a phenomenon that the electric charges are collected to a different region by en electric field to generate a transient current flow (SEE) is less likely to occur. Based on the above mechanism, this inverter has a configuration allowing the transistor 3P2 itself to be less subject to SEE. While SEE is likely to occur in the transistor 3P1, it has almost no impact on an output of the inverter. It is believed that this effect is obtained from the following mechanism. Even if the transistor 3P1 is turned on due to SEE, almost no adverse effect will reach the revered clock signal GBi through the transistor 3P2, because it is in the OFF state. Even though a potential at the node B is apt to increase due to the short line AB, a current flowing from the node A into the node B through the short line AB will largely flow toward the second voltage supply (voltage Vss) having a low load resistance, through the transistor 3N1, and thereby almost no current will flow toward the connection point of the inverted clock signal GBi through the transistor 3N2. Thus, even if the transistor 3P1 is turned on due to SEE, it has almost no impact on the inverted clock signal GBi. As above, irrespective of whether SEE occurs in the transistor 3P1 or in the transistor 3P2, the inversion of an output level from the inverter 3I will be effectively avoided.

Secondly, the operation will be described under the condition that the clock signal G is in a low level. In the inverter 3I under this condition, the transistors 3P1 and transistor 3P2 are in the ON state, and the transistors 3N1 and transistor 3N2 are in the OFF state. As in the above condition, a potential difference between the source and drain of the transistor 3N2 becomes approximately zero due to the shout line AB. This allows the transistor 3N2 to have almost no region with a high electric field therein, so as to be less subject to SEE. Further, even if SEE occurs in the transistor 3N1, a current flowing from the node A into the node B through the short line AB will largely flow toward the first voltage supply (voltage $V_{DD}$) having a low load resistance, through the transistor 3P1, and thereby almost no current will flow toward the connection point of the inverted clock signal GBi through the transistor 3P2. Thus, even if the transistor 3N1 is turned on due to SEE, it has almost no impact on the inverted clock signal GBi. As above, irrespective of whether SEE occurs in the transistor 3N1 or in the transistor 3N2, the inversion of an output level from the inverter 3I will be effectively avoided.

As described above, this inverter 3I is configured to allow each of the transistors themselves as components to be less subject to SEE. Further, even if SEE occurs therein, almost no adverse effect will reach an output of the inverter 3I. This makes it possible to provide enhanced SEE tolerance to the inverter 3I.

Figure 7:
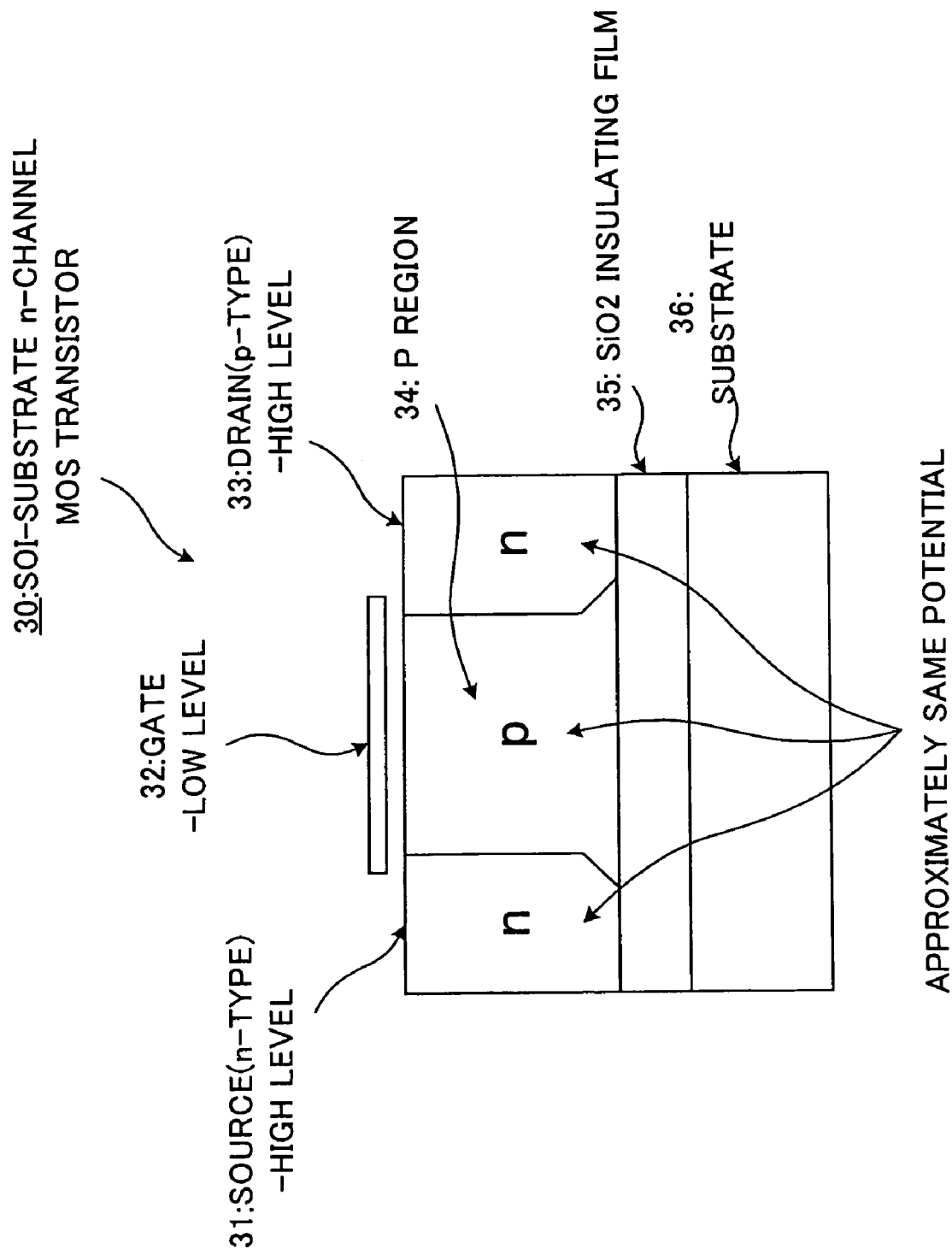
FIG. 7 is a sectional view of an SOI-substrate n-channel MOS transistor 10.

This enhancement in SEE tolerance can be particularly observed in an inverter formed on a substrate with an SOI (Silicon-On-Insulator) structure, as compared as an inverter formed on a bulk substrate. FIG. 7 is a sectional view of an SOI-substrate n-channel MOS transistor 30. In an SOI-based element, a body (p region 34) is floated from a substrate 36 by a $SiO_2$ insulating film 35. Thus, fundamentally, SEE is less likely to occur between the body and the substrate 36. What is particularly important is SEE which is likely to occur between the body and the source/drain. A potential of the body is varied depending on a voltage to be applied to source 31-drain 33. When a high-level voltage is applied to source-drain of the n-channel MOS transistor in its OFF state, while a potential of the body is reduced at a value equivalent to a diffusion potential, a potential difference between the source and drain will be kept at approximately zero because of the aforementioned mechanism, and no region with a high electric field will be formed in a PN junction region. Thus, the SOI substrate effectively contributes to prevent the occurrence of SEE.

Figure 8:
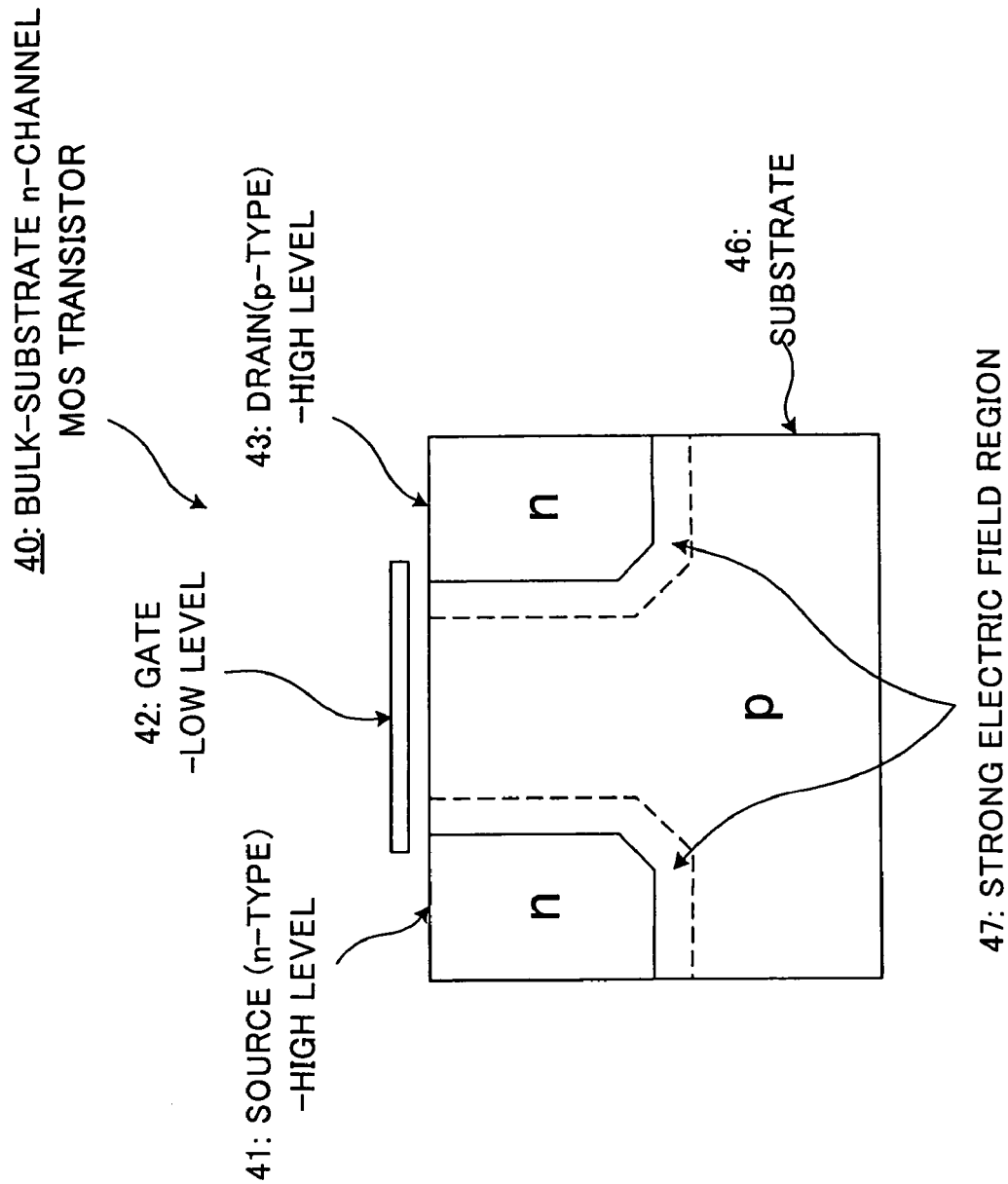
FIG. 8 is a sectional view of a bulk-substrate n-channel MOS transistor 20.

By way of comparison, a bulk-substrate based inverter will be described below. FIG. 8 is a sectional view of a bulk-substrate n-channel MOS transistor 40. This substrate does not have any insulating film as in the SOI substrate. Thus, in a p-type substrate 46, its voltage is kept at Vss. When a high-level voltage is applied to source 41-drain 43 of the n-channel MOS transistor in its OFF state, a PN junction region is reversely biased, and a high electric field region 47 will be formed. This would involve the risk of occurrence of SEE between the source/drain and substrate.

As above, while the present invention may be implemented using a bulk substrate as well as an SOI substrate, it is desirable to use an SOI substrate.

(Memory Element According to Second Embodiment of the Present Invention)

A memory element according to a second embodiment of the present invention will be described. A storage node can be obtained by cross-connecting respective outputs and inputs of two inverters directly or indirectly through a switching gate. For example, a memory element with such a storage node includes a SRAM (Static RAM), a flip-flop circuit and a latch circuit. Although not shown, the memory element according to the second embodiment has a storage node comprising at least two inverters each having the same configuration as that of the inverter 3I according to the first embodiment. This makes it possible to achieve a memory element having enhanced SEE tolerance. In this memory element, each of the inverters forming the storage mode has the same operation as that of the inverter 3I according to the first embodiment.

(Data Latch Circuit according to Third Embodiment of the Present Invention)

Figure 5:
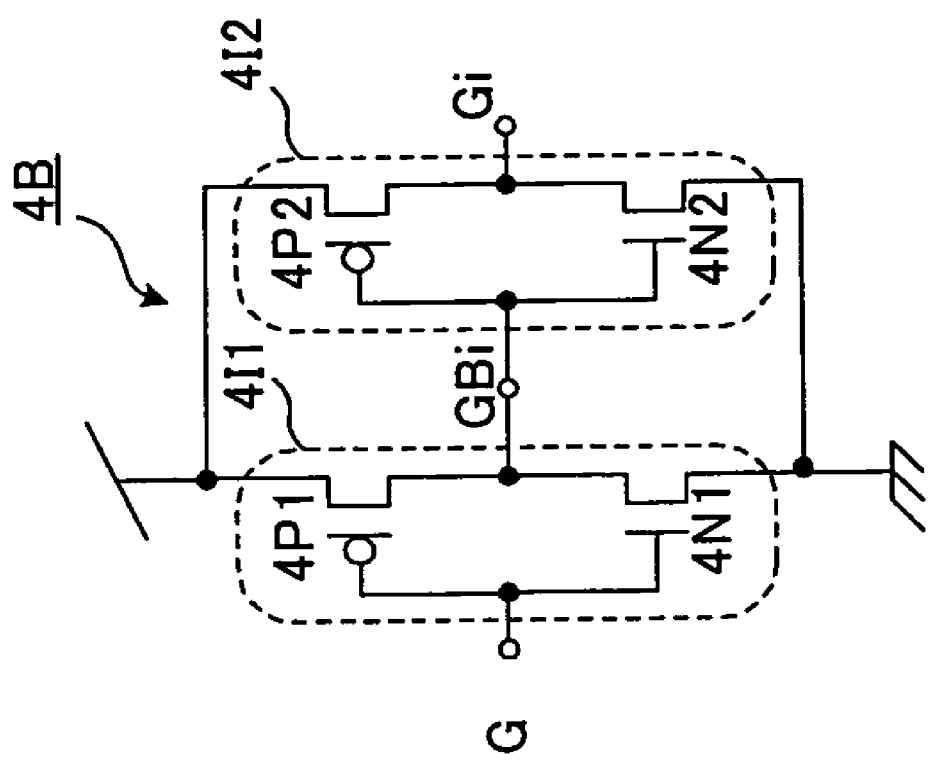
FIG. 5 is a circuit diagram showing the configuration of a buffer circuit to be used in combination with an SEE tolerant data latch circuit 4.
Figure 6:
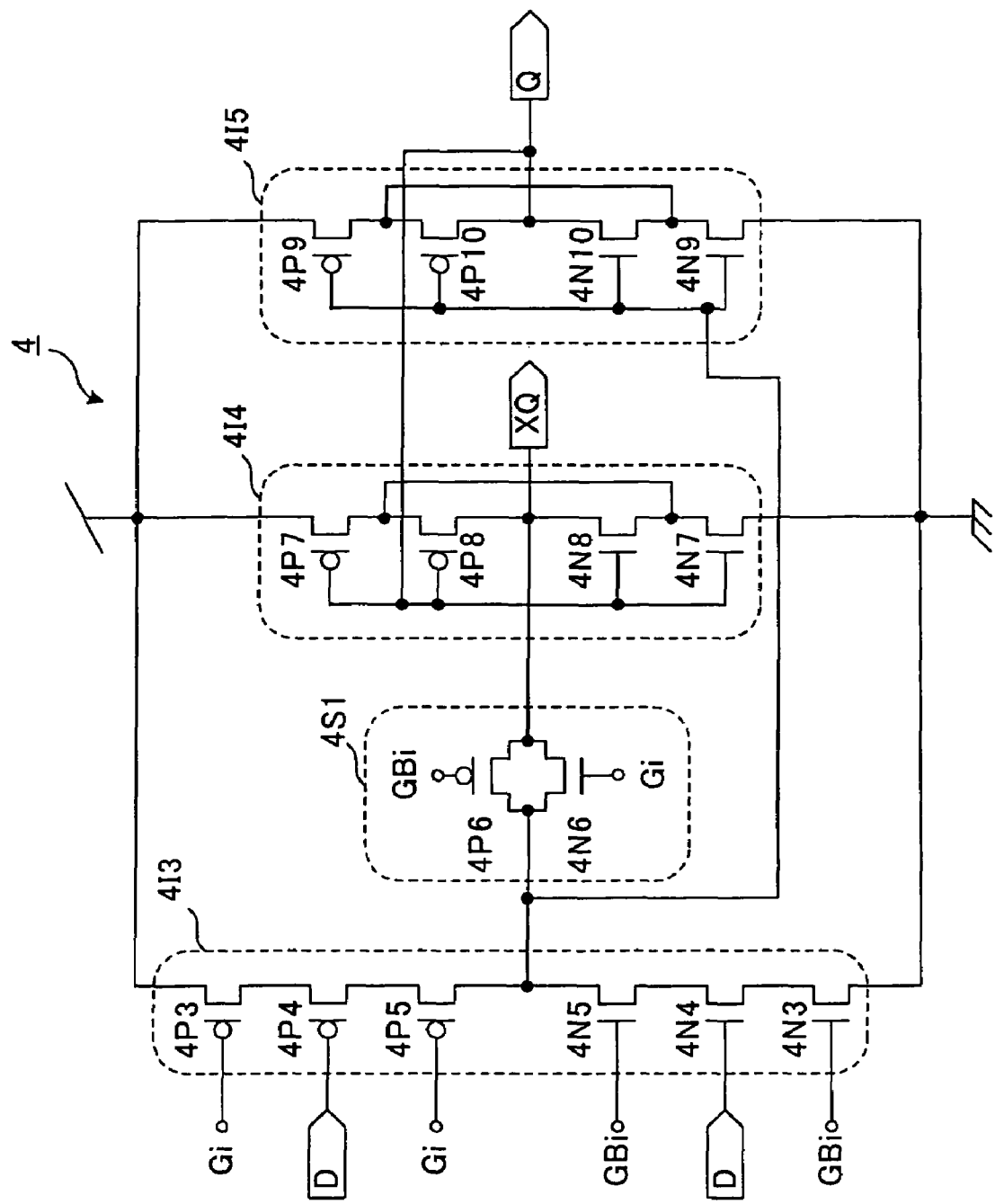
FIG. 6 is a circuit diagram showing the configuration of an SEE tolerant data latch circuit 4 according to a third embodiment of the present invention.

A data latch circuit 4 according to a third embodiment of the present invention will be described below. Firstly, the configuration of this data latch circuit 4 will be described. FIG. 6 is a circuit diagram of the data latch circuit 4. A buffer circuit 4B illustrated in FIG. 5 is used in combination with the data latch circuit 4 to shape a waveform of a clock signal G and an inverted clock signal GBi which are input into the data latch circuit 4. The buffer circuit 4B includes an inverter 4I1 and an inverter 4I2 which are connected to each other in a cascade arrangement. Viewed as a whole, the buffer circuit 4B generally comprises a clocked inverter 4I3 serving as an input stage, a transmission gate 4S1, the inverter 4I4 and the inverter 4I2.

The clocked inverter 4I1 comprises a p-channel MOS transistor 4P3, a p-channel MOS transistor 4P4, a p-channel MOS transistor 4P5, an n-channel MOS transistor 4N5, an n-channel MOS transistor 4N4 and an n-channel MOS transistor 4N3, which are connected in series with respect to a source or drain line in this order in a direction from a node connected to the side of a first voltage supply to a second voltage supply. A clock signal Gi and an inverted clock signal which are complementary clock signals are input, respectively, into a first gate group of respective gates of the p-channel MOS transistor 4P3 and the p-channel MOS transistor 4P5, and a second gate group of respective gates of the n-channel MOS transistor 4N3 and the n-channel MOS transistor 4N5. While a conventional clocked inverter comprises total four transistors consisting of two p-channel MOS transistors and two n-channel MOS transistors, this clocked inverter 4I1 comprises total six transistors consisting of three p-channel MOS transistors and three n-channel MOS transistors. In each of the p-channel MOS transistor group and the n-channel MOS transistor group, a first transistor having a gate connected to an input data signal D is sandwiched between two second and third transistors connected, respectively, on upper and lower sides of the first transistor. The clock signal Gi or the inverted clock signal GBi is connected to each of the second and third transistors. The clocked inverter 4I3 is operable, when the inverted clock signal GBi is in a high level, to invert the input data signal D and output the inverted signal to a transmission date 4S1 (inversion and then conduction). Further, when the inverted clock signal GBi is in a low level, an output terminal of the clocked inverter 4I3 is placed in a high impedance state (non-conduction).

The transmission gate 4S1 comprises a p-channel MOS transistor 4P6 and an n-channel MOS transistor 4N6 which are connected in parallel with each other. The inverted clock signal GBi is input into a gate of the transistor 4P6, and the clock signal Gi is input into a gate of the transistor 4N6. The transmission gate 4S1 is designed to be turned off (non-conduction, high impedance state) when the inverted clock signal Bi is in the high level, and turned on (conduction) when the inverted clock signal Bi is in the low level. As to the clock signal G, this operation is opposite in phase to that of the clocked inverter 4I1. That is, given that the clocked inverter 4I3 and the transmission gate 4S1 have a common logic value of the clock signal G, when one of them is in a conduction state, the other is in a non-conduction state. Either one of inverters 4I4, 4I5 may be designed as a clocked inverter to integrate the transmission gate 4S1 therewith.

The inverter 4I4 has an input connected to an output of the inverter 4I5, and an output connected to an output of the clocked inverter 4I3 and an input of the inverter 4I5, through the transmission gate 4S1. The output of the inverter 4I4 is also output to a connection point of an inverted output data signal XQ as an output of the data latch circuit 4. The inverter 4I4 has the same configuration as that of the SEE tolerant inverter 3I. The inverter 4I5 receives an output from the clocked inverter 4I3, and outputs a resulting signal to a connection point of an output data signal Q and an input of the inverter 4I4. The output of the inverter 4I5 is also output to the connection point of the output data signal Q as an output of the data latch circuit 4. The inverter 5I5 has the same configuration as that of the SEE tolerant inverter 3I.

An operation of the data latch circuit 4 will be described below. When the inverted clock signal GBi is in the high level, and the clock signal is in the low level, the clocked inverter 4I3 inverts an input data signal D and outputs the inverted input signal to the subsequent stage. The transmission gate 4S1 is in its OFF state, and thereby the output of the clocked inverter 4I3 is not transmitted to the input of the inverter 4I4. The output of the clocked inverter 4I3 is transmitted to the input of the inverter 4I5. In the inverter 4I5, this transmitted data is inverted to have the same logic value as that of the corresponding input data, and output as the output data Q. This output is also input into the inverter 4I4. In the inverter 4I4, this output is inverted to have a logic value opposite to that of the input data signal D, and output as the inverted output data signal XQ. In this state, the output data Q is output as a signal having the same logic level as that of the input data signal (transparent mode, through mode).

In a period of the high level in the clock signal G (inverted clock signal GBi: low level, the clock signal Gi: high level), the output of the clocked inverter 4I3 is placed in the high impedance state and no input data signal will be output to the subsequent stages. The transmission gate 4S1 is changed from the OFF state to the ON state to allow the output of the inverter 4I1 having the same logic value as that of the input data signal D to be passed therethrough, and transmitted to the inverter 4I4. The inverter 4I1 inverts the transmitted data to have a logic level opposite to that of the input data signal D, and transmits the inverted data to an input of the inverter 4I5. In the inverter 4I5, respective logic levels of the input and the output are opposite to each other, and this state is stably held in the storage node composed of the inverter 4I1 and 4I5. Then, the storage node outputs the output data signal Q having the same logic level as the input data signal at a time of rising edge of the output data signal Q (latch mode). This state will be continued until the clock signal has a low level.

A relation between the data latch circuit 4 and SEE will be described below. As to the storage node composed of the inverter 4I4 and the inverter 4I5, each of these inverters consists of the SEE tolerant inverter. Thus, the storage node can effectively prevent the occurrence of SEE. This makes it possible to effectively prevent the inversion of stored data which would otherwise occur in this storage node by SEE.

As to the clocked inverter 4I3 in the input stage, the risk of SEE has to be considered, particularly in a state when the data latch circuit 4 is in the latch state, and the output of clocked inverter 4I3 is in the high impedance state. Specifically, in the latch mode, each of the four transistors each having a gate connected with the clock signal G and the inverted clock signal GBi is in the OFF state. If one of the transistors is turned on due to SEE, it is likely that the clocked inverter 4I3 momentarily outputs the input data signal D (after inverting) to the subsequent stage. If this input data signal D has a logic level opposite to a logic state stored on the storage node, the stored data will be inverted (occurrence of SEE).

In the latch mode, the clocked inverter 4I3 according to the present invention can effectively prevent the input data signal D from adversely affecting the subsequent stages, based on the following mechanism. The clocked inverter 4I3 comprises the six transistors consisting of the three p-channel MOS transistors and three n-channel MOS transistors. In each of the p-channel and n-channel MOS transistor groups, the first transistor having the gate connected to the input data signal D is sandwiched between the two second and third transistors connected, respectively, on upper and lower sides of the first transistor. In the latch state, the transistor 4P3 and the transistor 4P5 are in the OFF state. Thus, the input data signal D is blocked, and prevented from being output to the subsequent stages. Given that either one of the transistor 4P3 and the transistor 4P5 is turned on due to SEE. However, the other transistor is in the OFF state, and thereby the input data signal D is still blocked. The group of the transistor 4N3, the transistor 4N4 and the transistor 4N5 has the same effect. This makes it possible to effectively prevent a malfunction of the clocked inverter 4I3.

The transistor 4P3 and the transistor 4P5 can be arranged instead of the above arrangement of sandwiching the transistor 4P4 therebetween. Specifically, the transistor 4P3 and the transistor 4P5 may be connected in series in adjacent relation to each other, and then connected to the transistor 4P4 on the side of the first voltage source, or may be connected in series in adjacent relation to each other, and then connected to the side of the second voltage source. Even if either one of the transistors is turned on due to SEE, this arrangement can also prevent an adverse effect of the input data signal D from being output to the subsequent stages, as long as the remaining transistor is kept in the OFF state. In comparison to this arrangement, when two transistors each having a gate connected to the inverted clock signal GBi are connected, respectively, to positions on both sides of the transistor 4P4, as in this embodiment, a distance between respective gates of the transistor 4P3 and the transistor 4P5 can be increased. The increased inter-gate distance can significantly lower the probability that just one attack of high-energy particles simultaneously causes SEE in the two transistors. The group of the transistor 4N3, the transistor 4N4 and the transistor 4N5 has the same effect. Thus, it is preferable that two transistors adapted to be controlled by the clock are arranged, respectively, on both sides of a transistor adapted to receive input data signal D.

(NAND Element According to Fourth Embodiment of the Present Invention)

Figure 13:
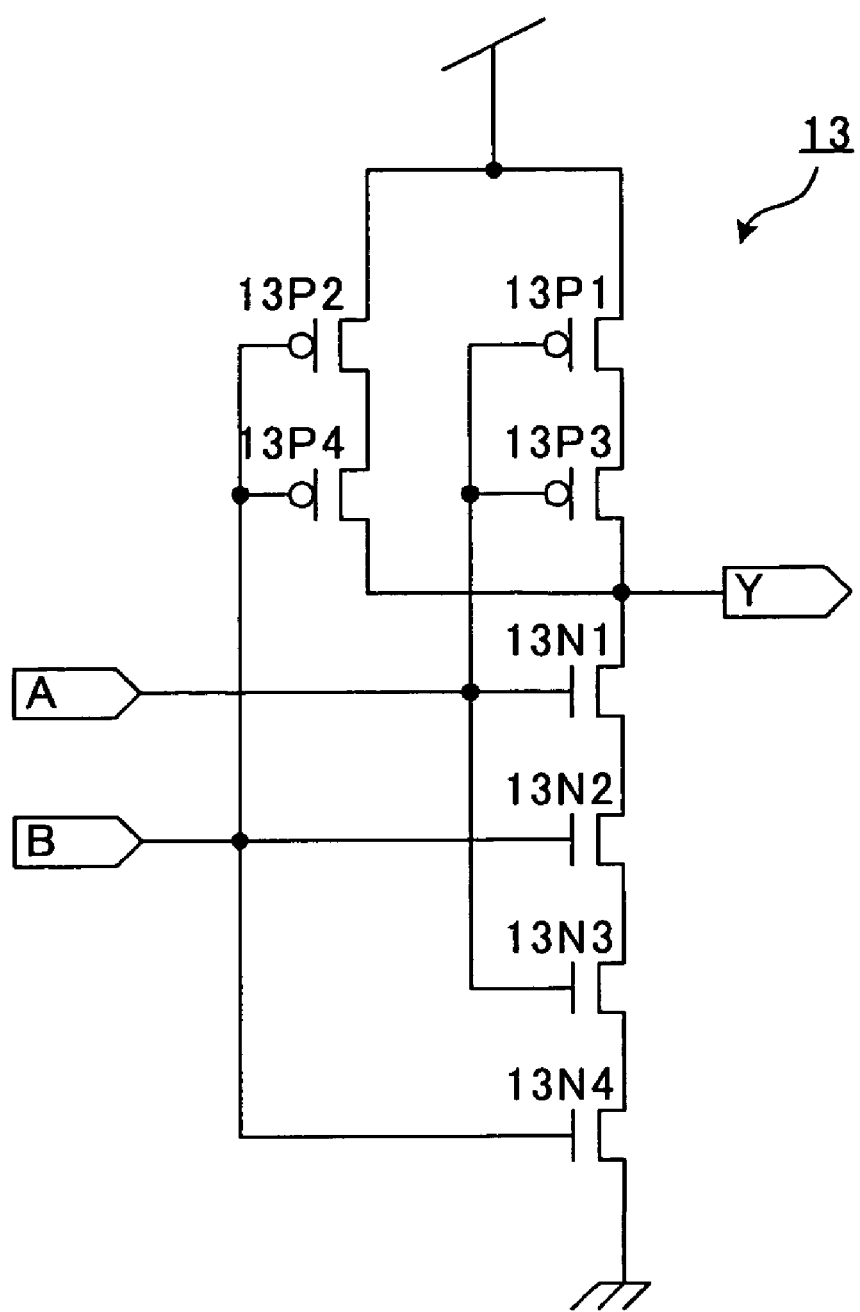
FIG. 13 is a circuit diagram showing the configuration of a 2-input NAND element 13 according to a fourth embodiment of the present invention.

A NAND element according to a fourth embodiment of the present invention will be described. Firstly, a 2-input NAND element 13 will be described. FIG. 13 is a circuit diagram of the 2-input NAND element 13. The 2-input NAND element 13 comprises: a pair of a first p-channel MOS transistor 13P1 and a second p-channel MOS transistor 13P2 which have channels connected in parallel with each other; and a pair of a first n-channel MOS transistor 13N1 and a second n-channel MOS transistor 13N1 which have channels connected in series with each other. The p-channel MOS transistor pair (13P1, 13P2) and the n-channel MOS transistor pair (13N1, 13N2) are formed on a substrate having an SOI structure, and connected in series in a direction from a node connected to the side of a first voltage source to a node connected to the side of a second voltage source. Respective gates of the first p-channel MOS transistor 13P1 and the first n-channel MOS transistor 13N1 are connected to a first input A, and respective gates of the second p-channel MOS transistor 13P2 and the second n-channel MOS transistor 13N2 are connected to a second input B. Further, a node between the p-channel MOS transistor pair (13P1, 13P2) and the n-channel MOS transistor pair (13N1, 13N2) is connected to an output Y Each of the first p-channel MOS transistor 13P1, the second p-channel MOS transistor 13P2, the first n-channel MOS transistor 13N1 and the second n-channel MOS transistor 13N2, is combined with an additional MOS transistor (13P3, 13P4, 13N1, 13N4) having a channel of the same conductive type as that thereof and a gate interconnected to a gate thereof, in such a manner that their channels are connected in series. In this manner, the 2-input NAND element 13 is formed as an SEE tolerant SOI-based 2-input NAND element with a double structure.

Preferably, in the 2-input NAND element 13, two of the additional n-channel MOS transistor (13N3, 13N4) combined, respectively, with the first n-channel MOS transistor 13N1 and the second n-channel MOS transistor 13N2 through their series-connected channels for forming the double structure, are connected thereto except for a position between the first and second n-channel MOS transistors 13N1, 13N2. Thus, in each pair of series-connected or n-channel transistors forming a double structure, the additional transistor can be arranged at a position distant from the other transistor. This makes it possible to prevent both the double-structured transistors from being simultaneously turned on due to attack of high-energy particles, so as to achieve further enhanced SEE tolerance.

Figure 9:
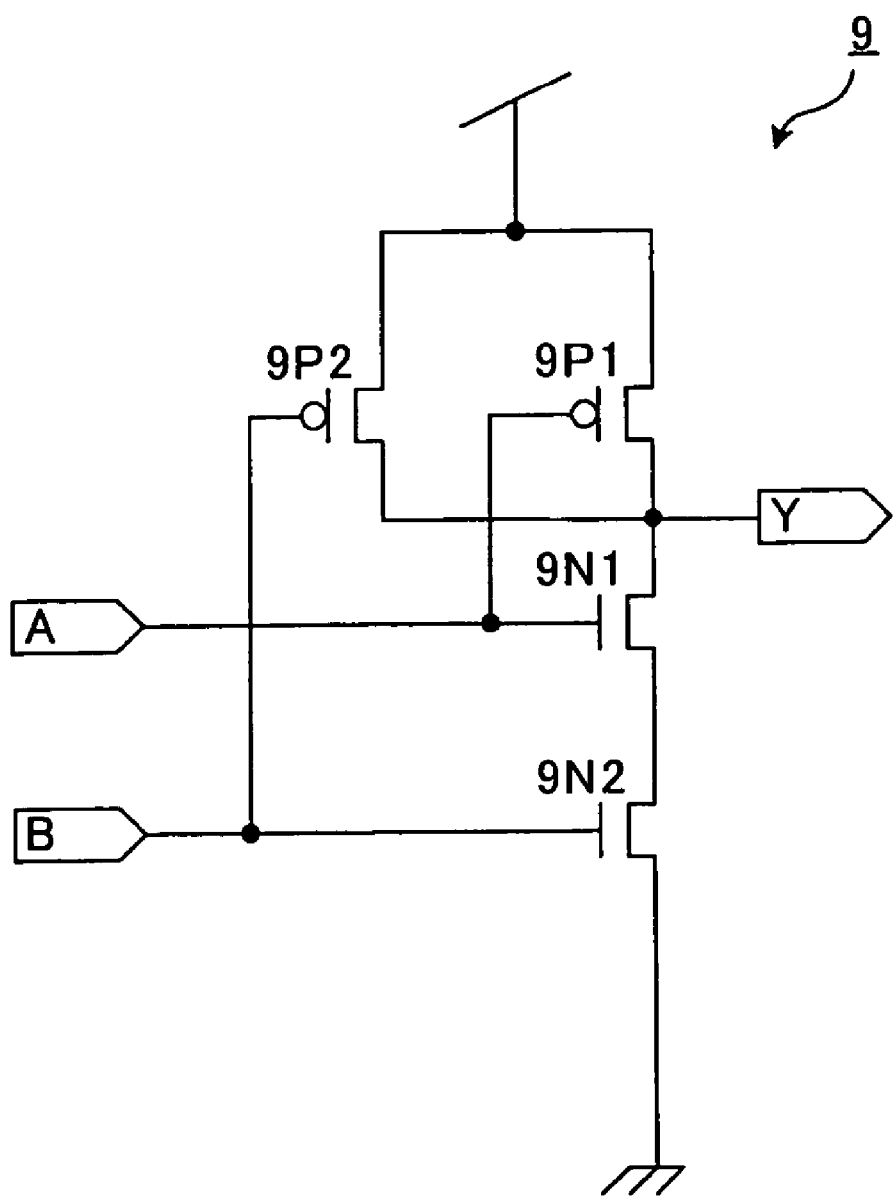
FIG. 9 is a circuit diagram showing the configuration of a conventional 2-input NAND element 9.

An operation of the 2-input NAND element 13 will be described in comparison with a conventional 2-input NAND element 9 illustrated in FIG. 9. Given that the input A is in a high level, and the input B is in a low level. In this state, a p-channel MOS transistor 9P1, an n-channel MOS transistor 9N1, a p-channel MOS transistor 9P2 and an n-channel MOS transistor 9N2 in the conventional 2-input NAND element 9 are changed, respectively, to an OFF state, ON state, ON state and OFF state, and the output Y has a high level. If the n-channel MOS transistor 9N2 in the OFF state is turned on due to its malfunction caused by an incident high-energy particle beam, the output Y is shifted from the high level to a low level, or a logic value is inverted, resulting in occurrence of SEE. In the above state, the pair of p-channel MOS transistors 13P1, 13P3, the pair of n-channel MOS transistors 13N1, 13N3, the pair of p-channel MOS transistors 13P2, 13P4 and the pair of n-channel MOS transistor 13N2, 13N4 in the 2-input NAND element 13 are changed, respectively, to an OFF state, ON state, ON state and OFF state, and the output Y has a high level. Differently from the conventional 2-input NAND element 9, even if the n-channel MOS transistor 13N2 in the OFF state is turned on due to its malfunction caused by an incident high-energy particle beam, a change in level due to the malfunction will be blocked by the n-channel MOS transistor 13N4 connected in series thereto and kept in the OFF state. This makes it possible to keep the output Y in the high level so as to prevent the occurrence of SEE.

Figure 14:
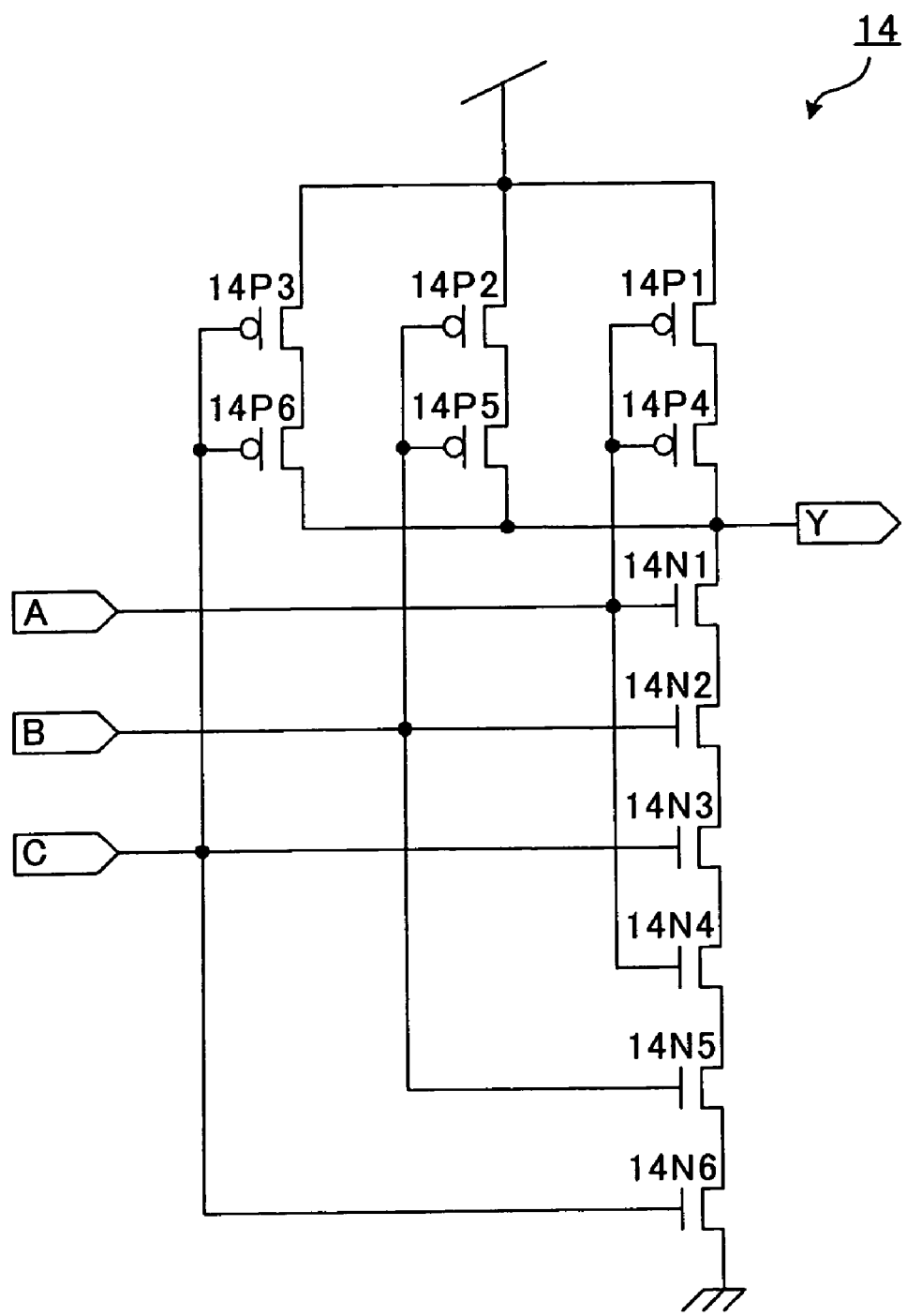
FIG. 14 is a circuit diagram showing the configuration of a 3-input NAND element 14 according to a fourth embodiment of the present invention.

Secondary, a 3-input NAND element 14 will be described. FIG. 14 is a circuit diagram of the 3-input NAND element 14. The 3-input NAND element comprises: a group of a first p-channel MOS transistor 14P1, a second p-channel MOS transistor 14P2 and a third p-channel MOS transistor 14P3 which have channels connected in parallel with each other; and a group of a first n-channel MOS transistor 14N1 a second n-channel MOS transistor 14N2 and a third n-channel MOS transistor 14N3 which have channels connected in series with each other. The p-channel MOS transistor group (14P1, 14P2, 14P3) and the n-channel MOS transistor group (14N1, 14N2, 14N3) are formed on a substrate having an SOI structure, and connected in series in a direction from a node connected to the side of a first voltage source to a node connected to the side of a second voltage source. Respective gates of the first p-channel MOS transistor 14P1 and the first n-channel MOS transistor 14N1 are connected to a first input A, and respective gates of the second p-channel MOS transistor 14P2 and the second n-channel MOS transistor 14N2 are connected to a second input B. Further, respective gates of the third p-channel MOS transistor 14P3 and the third n-channel MOS transistor 14N3 are connected to a third input C, and a node between the p-channel MOS transistor group (14P1, 14P2, 14P3) and the n-channel MOS transistor group (14N1, 14N2, 14N3) is connected to an output Y. Each of the first p-channel MOS transistor 14P1, the second p-channel MOS transistor 14P2, the third p-channel MOS transistor 14P3, the first n-channel MOS transistor 14N1, the second n-channel MOS transistor 14N2 and the third n-channel MOS transistor 14N3, is combined with an additional MOS transistor (14P4, 14P5, 14P6, 14N4, 14N5, 14N6) having a channel of the same conductive type as that thereof and a gate interconnected to a gate thereof, in such a manner that their channels are connected in series. In this manner, the 3-input NAND element 14 is formed as, so as to form an SEE tolerant SOI-based 3-input NAND element with a double structure.

Preferably, in the 3-input NAND element, the three additional n-channel MOS transistor (14N4, 14N5, 14N6) combined, respectively, with the first n-channel MOS transistor 14N1, the second n-channel MOS transistor 14N2 and the third n-channel MOS transistor 14N3 through their series-connected channels for forming the double structure, are connected thereto except for a position between any two of the first, second and third n-channel MOS transistors 14N1, 14N2, 14N3. In each pair of series-connected or n-channel transistors forming a double structure, the additional transistor can be arranged at a position distant from the other transistor. This makes it possible to prevent both the double-structured transistors from being simultaneously turned on due to attack of high-energy particles, so as to achieve further enhanced SEE tolerance.

Figure 10:
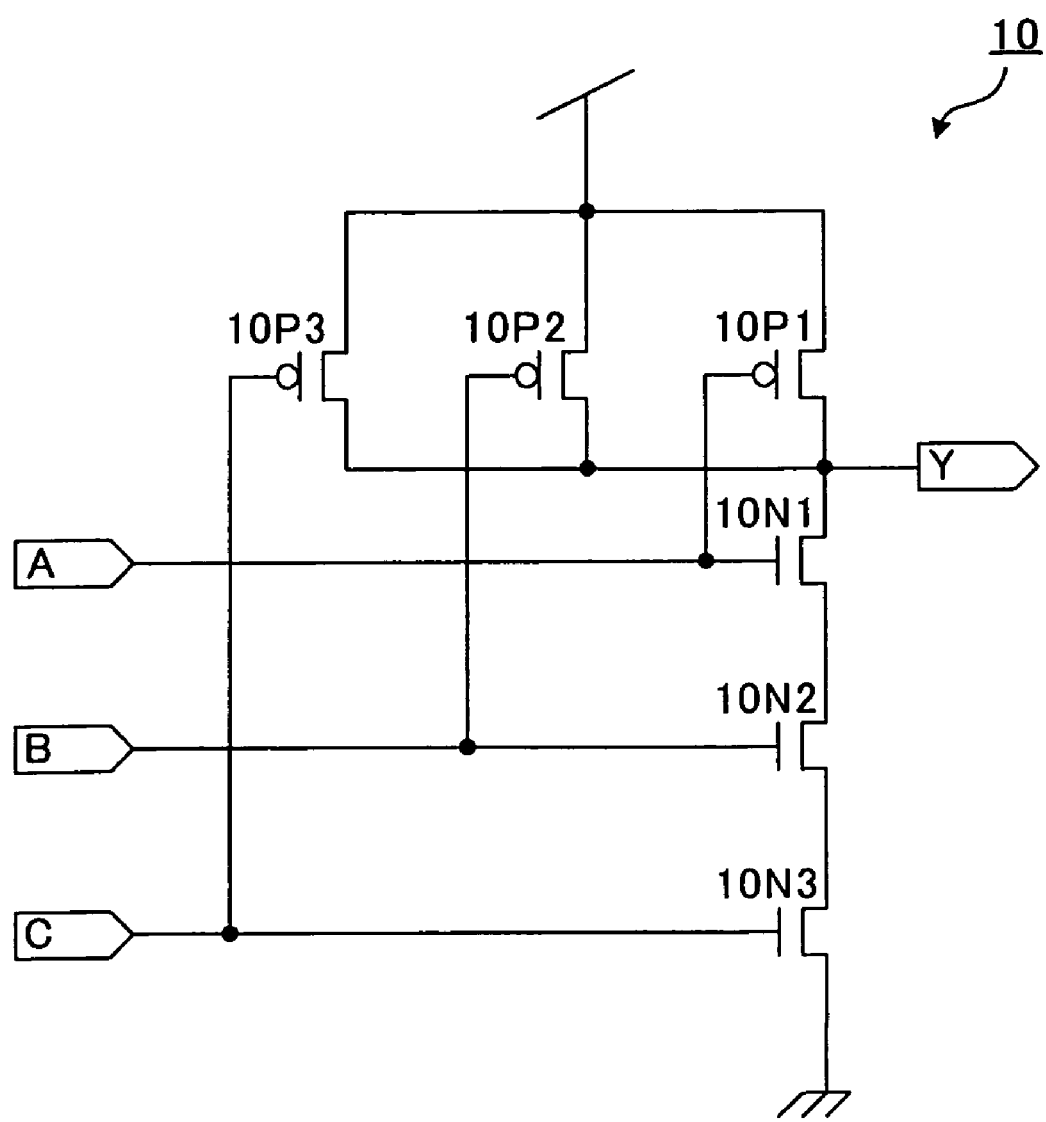
FIG. 10 is a circuit diagram showing the configuration of a conventional 3-input NAND element 10.

An operation of the 3-input NAND element 14 will be described in comparison with a conventional 3-input NAND element 10 illustrated in FIG. 10. Given that the input A, the input B and the input C are, respectively, in a high level, in a high level and in a low level. In this state, a p-channel MOS transistor 10P1, an n-channel MOS transistor 10N1, a p-channel MOS transistor 10P2, an n-channel MOS transistor 10N2, a p-channel MOS transistor 10P3 and an n-channel MOS transistor 10N3 in the conventional 3-input NAND element 10 are changed, respectively, to an OFF state, ON state, OFF state, ON state, ON state and OFF state, and the output Y has a high level. If the n-channel MOS transistor 10N3 in the OFF state is turned on due to its malfunction caused by an incident high-energy particle beam, the output Y is shifted from the high level to a low level, or a logic value is inverted, resulting in occurrence of SEE. In the above state, the pair of p-channel MOS transistors 14P1, 14P4, the pair of n-channel MOS transistors 14N1, 14N4, the pair of p-channel MOS transistors 14P2, 14P5, the pair of n-channel MOS transistor 14N2, 14N5, the pair of p-channel MOS transistors 14P3, 14P6 and the pair of n-channel MOS transistor 14N3, 14N6, in the 3-input NAND element 14 are changed, respectively, to an OFF state, ON state, OFF state, ON state, ON state and OFF state, and the output Y has a high level. Differently from the conventional 3-input NAND element 10, even if the n-channel MOS transistor 14N3 in the OFF state is turned on due to its malfunction caused by an incident high-energy particle beam, a change in level due to the malfunction will be blocked by the n-channel MOS transistor 14N6 connected in series thereto and kept in the OFF state. This makes it possible to keep the output Y in the high level so as to prevent the occurrence of SEE.

(NOR Element According to Fifth Embodiment of the Present Invention)

Figure 15:
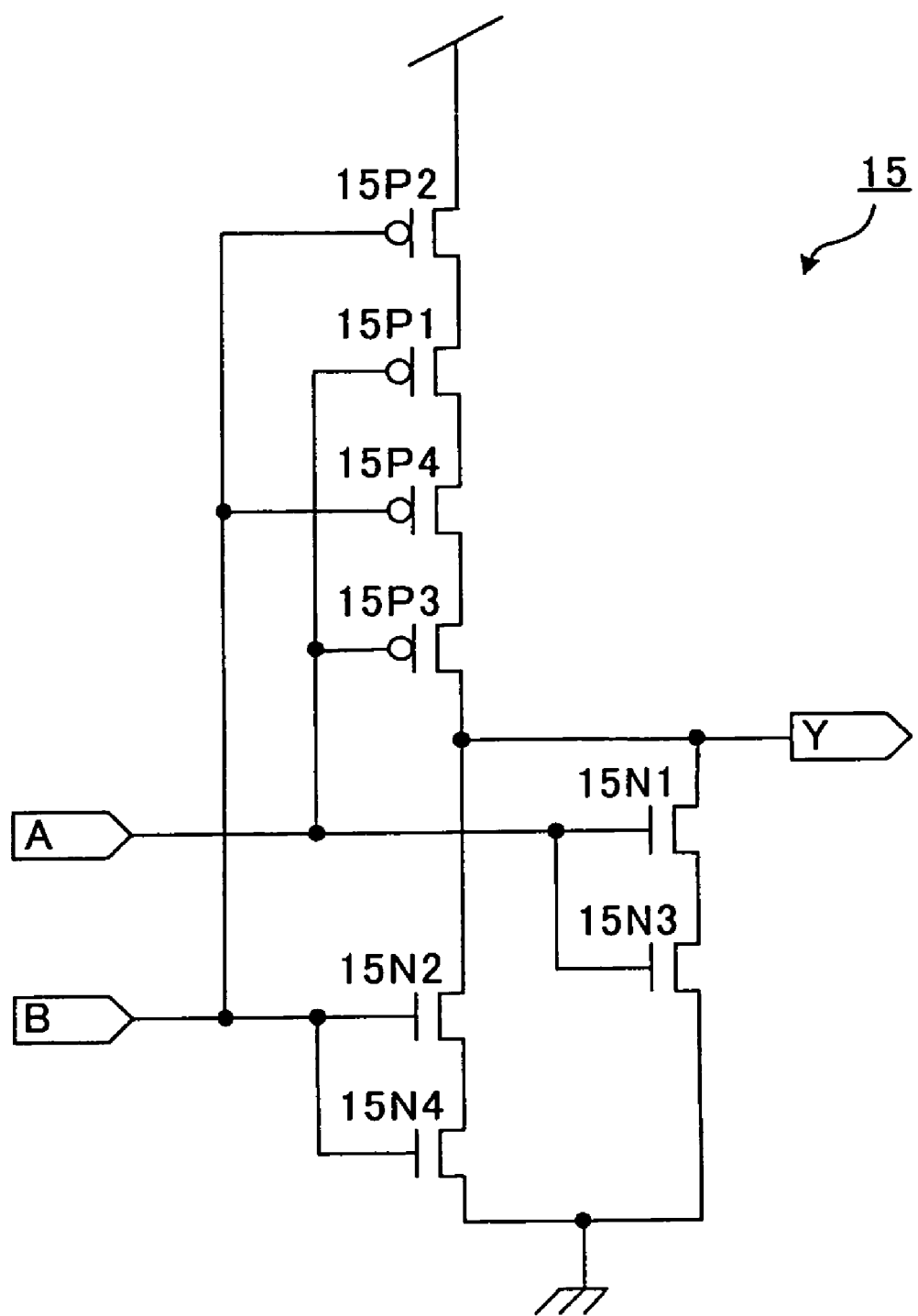
FIG. 15 is a circuit diagram showing the configuration of a 2-input NOR element 15 according to a fifth embodiment of the present invention.

A NOR element according to a fifth embodiment of the present invention will be described. Firstly, a 2-input NOR element 15 will be described. FIG. 15 is a circuit diagram of the 2-input NOR element 15. The 2-input NOR element 15 comprises: a pair of a first p-channel MOS transistor 15P1 and a second p-channel MOS transistor 15P2 which have channels connected in series with each other; and a pair of a first n-channel MOS transistor 15N1 and a second n-channel MOS transistor 15N2 which have channels connected in parallel with each other. The p-channel MOS transistor pair (15P1, 15P2) and the n-channel MOS transistor pair (15N1, 15N2) are formed on a substrate having an SOI structure, and connected in series in a direction from a node connected to the side of a first voltage source to a node connected to the side of a second voltage source. Respective gates of the first p-channel MOS transistor 15P1 and the first n-channel MOS transistor 15N1 are connected to a first input A, and respective gates of the second p-channel MOS transistor 15P2 and the second n-channel MOS transistor 15N2 are connected to a second input B. Further, a node between the p-channel MOS transistor pair (1SP1, 15P2) and the n-channel MOS transistor pair (15N1, 15N2) is connected to an output Y. Each of the first p-channel MOS transistor 15P1, the second p-channel MOS transistor 15P2, the first n-channel MOS transistor 15N1 and the second n-channel MOS transistor 15N2, is combined with an additional MOS transistor (15P3, 15P4, 15N1, 15N4) having a channel of the same conductive type as that thereof and a gate interconnected to a gate thereof, in such a manner that their channels are connected in series. In this manner, the 2-input NOR element 15 is formed as an SEE tolerant SOI-based 2-input NOR element with a double structure.

Preferably, in the 2-input NOR element 15, two of the additional p-channel MOS transistor (15P3, 15P4) combined, respectively, with the first p-channel MOS transistor 15P1 and the second p-channel MOS transistor 15P2 through their series-connected channels for forming the double structure, are connected thereto except for a position between the first and second p-channel MOS transistors 15P1, 15P2. Thus, in each pair of series-connected or p-channel transistors forming a double structure, the additional transistor can be arranged at a position distant from the other transistor. This makes it possible to prevent both the double-structured transistors from being simultaneously turned on due to attack of high-energy particles, so as to achieve further enhanced SEE tolerance.

Figure 11:
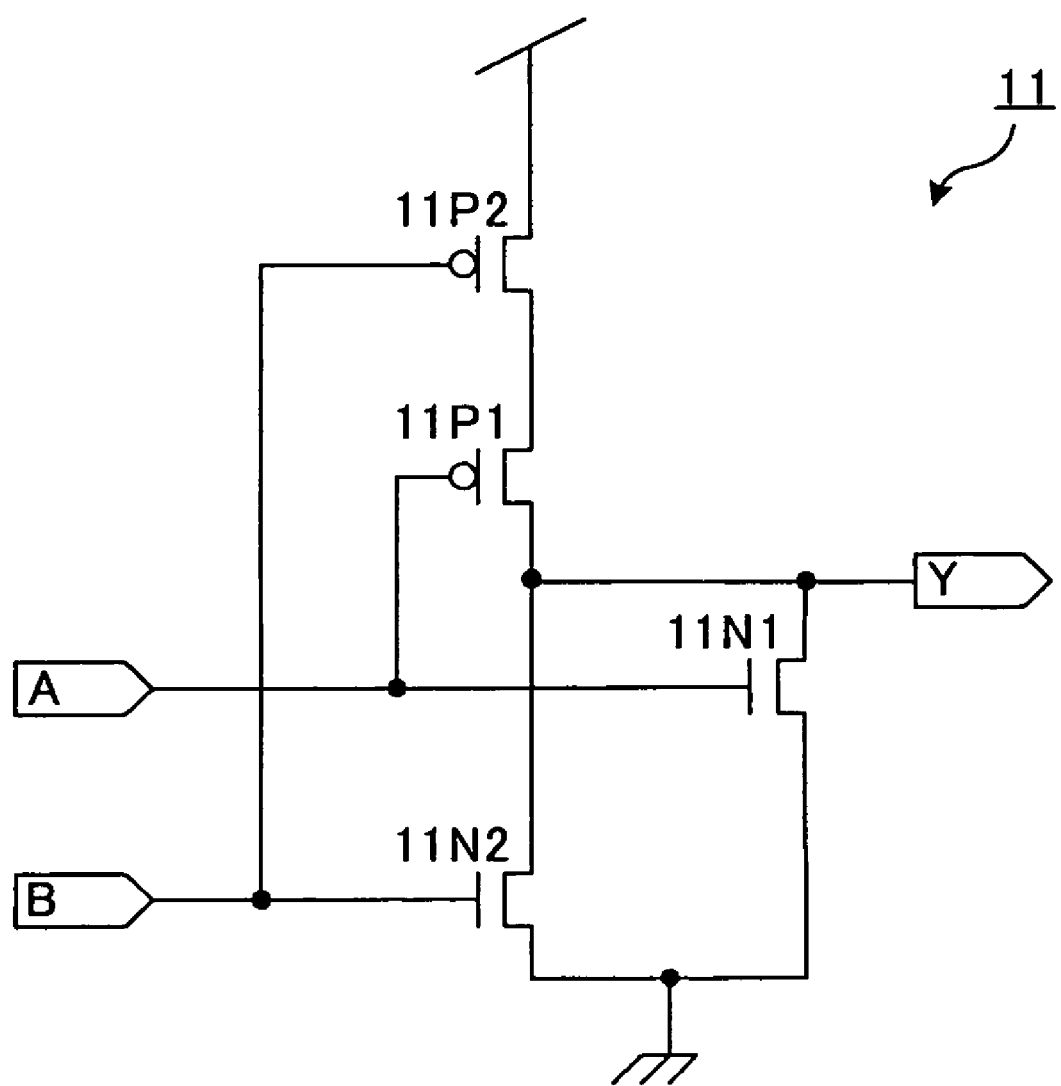
FIG. 11 is a circuit diagram showing the configuration of a conventional 2-input NOR element 11.

An operation of the 2-input NOR element 15 will be described in comparison with a conventional 2-input NOR element 11 illustrated in FIG. 11. Given that the input A is in a high level, and the input B is in a low level. In this state, a p-channel MOS transistor 11P1, an n-channel MOS transistor 11N1, a p-channel MOS transistor 11P2 and an n-channel MOS transistor 11N2 in the conventional 2-input NOR element 11 are changed, respectively, to an OFF state, ON state, ON state and OFF state, and the output Y has a low level. If the p-channel MOS transistor 11P1 in the OFF state is turned on due to its malfunction caused by an incident high-energy particle beam, the output Y is shifted from the low level to a high level, or a logic value is inverted, resulting in occurrence of SEE. In the above state, the pair of p-channel MOS transistors 15P1, 15P3, the pair of n-channel MOS transistors 15N1, 15N3, the pair of p-channel MOS transistors 15P2, 15P4 and the pair of n-channel MOS transistor 15N2, 15N4 in the 2-input NOR element 15 are changed, respectively, to an OFF state, ON state, ON state and OFF state, and the output Y has a low level. Differently from the conventional 2-input NOR element 11, even if the n-channel MOS transistor 15N2 in the OFF state is turned on due to its malfunction caused by an incident high-energy particle beam, a change in level due to the malfunction will be blocked by the n-channel MOS transistor 15N4 connected in series thereto and kept in the OFF state. This makes it possible to keep the output Y in the high level so as to prevent the occurrence of SEE.

Figure 16:
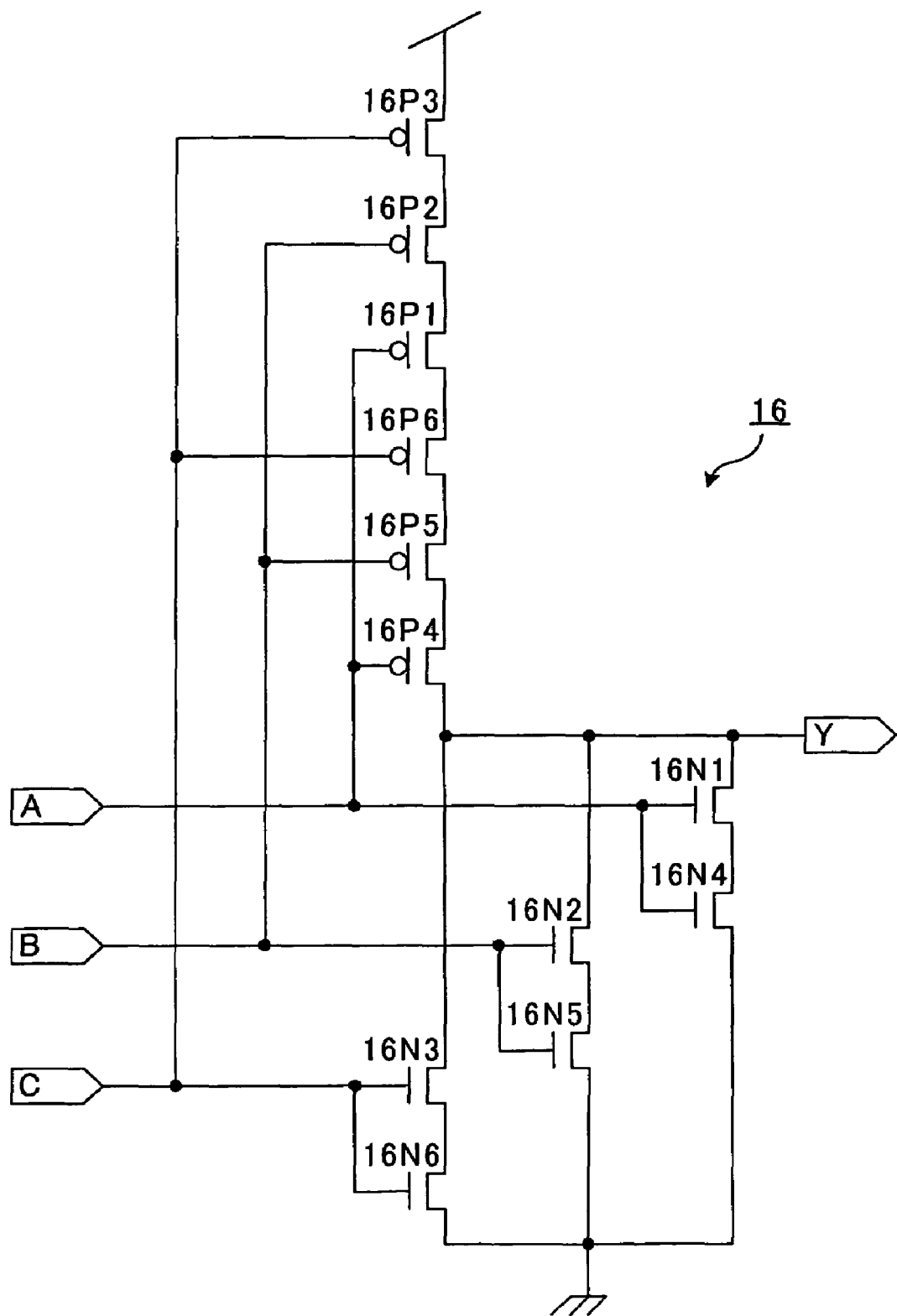
FIG. 16 is a circuit diagram showing the configuration of a 3-input NOR element 16 according to a fifth embodiment of the present invention.

Secondary, a 3-input NOR element 16 will be described. FIG. 16 is a circuit diagram of the 3-input NOR element 16. The 3-input NOR element comprises: a group of a first p-channel MOS transistor 16P1, a second p-channel MOS transistor 16P2 and a third p-channel MOS transistor 16P3 which have channels connected in series with each other; and a group of a first n-channel MOS transistor 16N1 a second n-channel MOS transistor 16N2 and a third n-channel MOS transistor 16N3 which have channels connected in parallel with each other. The p-channel MOS transistor group (16P1, 16P2, 16P3) and the n-channel MOS transistor group (16N1, 16N2, 16N3) are formed on a substrate having an SOI structure, and connected in series in a direction from a node connected to the side of a first voltage source to a node connected to the side of a second voltage source. Respective gates of the first p-channel MOS transistor 16P1 and the first n-channel MOS transistor 16N1 are connected to a first input A, and respective gates of the second p-channel MOS transistor 16P2 and the second n-channel MOS transistor 16N2 are connected to a second input B. Further, respective gates of the third p-channel MOS transistor 16P3 and the third n-channel MOS transistor 16N3 are connected to a third input C, and a node between the p-channel MOS transistor group (16P1, 16P2, 16P3) and the n-channel MOS transistor group (16N1, 16N2, 16N3) is connected to an output Y. Each of the first p-channel MOS transistor 16P1, the second p-channel MOS transistor 16P2, the third p-channel MOS transistor 16P3, the first n-channel MOS transistor 16N1, the second n-channel MOS transistor 16N2 and the third n-channel MOS transistor 16N3, is combined with an additional MOS transistor (16P4, 16P5, 16P6, 16N4, 16N5, 16N6) having a channel of the same conductive type as that thereof and a gate interconnected to a gate thereof, in such a manner that their channels are connected in series. In this manner, the 3-input NOR element 16 is formed as, so as to form an SEE tolerant SOI-based 3-input NOR element with a double structure.

Preferably, in the 3-input NOR element, the three additional p-channel MOS transistor (16P4, 16P5, 16P6) combined, respectively, with the first p-channel MOS transistor 16P1, the second p-channel MOS transistor 16P2 and the third p-channel MOS transistor 16P3 through their series-connected channels for forming the double structure, are connected thereto except for a position between any two of the first, second and third n-channel MOS transistors 16P1, 16P2, 16P3. In each pair of series-connected or p-channel transistors forming a double structure, the additional transistor can be arranged at a position distant from the other transistor. This makes it possible to prevent both the double-structured transistors from being simultaneously turned on due to attack of high-energy particles, so as to achieve further enhanced SEE tolerance.

Figure 12:
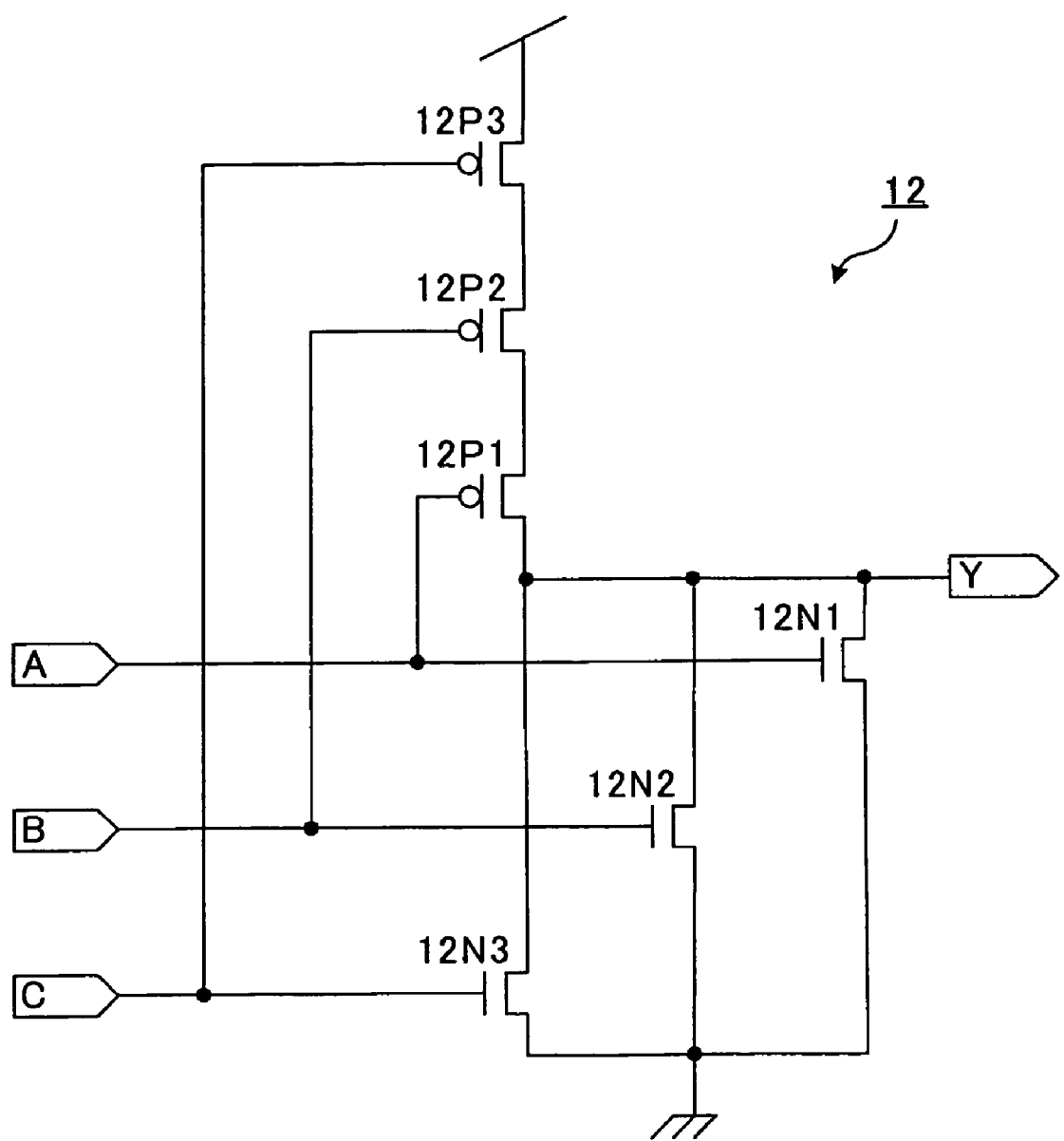
FIG. 12 is a circuit diagram showing the configuration of a conventional 3-input NOR element 12.

An operation of the 3-input NOR element 16 will be described in comparison with a conventional 3-input NOR element 12 illustrated in FIG. 12. Given that the input A, the input B and the input C are, respectively, in a high level, in a low level and in a low level. In this state, a p-channel MOS transistor 12P1, an n-channel MOS transistor 12N1, a p-channel MOS transistor 12P2, an n-channel MOS transistor 12N2, a p-channel MOS transistor 12P3 and an n-channel MOS transistor 12N3 in the conventional 3-input NOR element 12 are changed, respectively, to an OFF state, ON state, ON state, OFF state, ON state and OFF state, and the output Y has a low level. If the p-channel MOS transistor 12P1 in the OFF state is turned on due to its malfunction caused by an incident high-energy particle beam, the output Y is shifted from the low level to a high level, or a logic value is inverted, resulting in occurrence of SEE. In the above state, the pair of p-channel MOS transistors 16P1, 16P4, the pair of n-channel MOS transistors 16N1, 16N4, the pair of p-channel MOS transistors 16P2, 16P5, the pair of n-channel MOS transistor 16N2, 16N5, the pair of p-channel MOS transistors 16P3, 16P6 and the pair of n-channel MOS transistor 16N3, 16N6, in the 3-input NOR element 16 are changed, respectively, to an OFF state, ON state, ON state, OFF state, ON state and OFF state, and the output Y has a low level. Differently from the conventional 3-input NOR element 12, even if the p-channel MOS transistor 16P1 in the OFF state is turned on due to its malfunction caused by an incident high-energy particle beam, a change in level due to the malfunction will be blocked by the p-channel MOS transistor 16P4 connected in series thereto and kept in the OFF state. This makes it possible to keep the output Y in the high level so as to prevent the occurrence of SEE.

What is claimed:

1. A single-event-effect tolerant SOI-based inverter comprising a first p-channel MOS transistor and a first n-channel MOS transistor, which are formed on a substrate having an SOI structure to provide a floating body structure, and connected in series with respect to a source or drain line in this order in a direction from a node connected to the side of a first voltage source to a node connected to the side of a second voltage source, wherein:

each of said first p-channel MOS transistor and said first n-channel MOS transistor is combined with a second MOS transistor having a channel of a same conductive type as that thereof and a gate interconnected to a gate thereof, in such a manner that they are connected in series with respect to the source or drain line, and respective nodes between said first and second p-channel MOS transistors and between said first and second n-channel MOS transistors are connected together via a short line, so as to formed a double structure.

2. A single-event-effect tolerant SOI-based inverter comprising:

a first p-channel MOS transistor, a second p-channel MOS transistor, a first n-channel MOS transistor and a second n-channel MOS transistor, which are formed on a substrate having an SOI structure to provide a floating body structure, and connected in series with respect to a source or drain line in this order in a direction from a node connected to the side of a first voltage source to a node connected to the side of a second voltage source, wherein:

said first p-channel MOS transistor, said second p-channel MOS transistor, said first n-channel MOS transistor and said second n-channel MOS transistor are arranged to form an inverter circuit;

respective gates of said first p-channel MOS transistor, said second p-channel MOS transistor, said first n-channel MOS transistor and said second n-channel MOS transistors are connected to a common node so as to be connected to an input of said inverter circuit, and respective nodes between said first and second p-channel MOS transistors and between said first and second n-channel MOS transistor are connected together via a short line, whereby said first and second p-channel MOS transistors are formed as a double-structured p-channel MOS transistor, and said first and second n-channel MOS transistors are formed as a double-structured n-channel MOS transistor.

3. A single-event-effect tolerant SOI-based semiconductor memory device which is formed on a substrate having an SOI structure to provide a floating body structure and including two inverters, said inverters having respective outputs cross-connected to respective inputs thereof directly or indirectly through a switching gate, wherein at least one of said inverters consists of the single-event-effect tolerant SOI-based inverter as defined in claim 1 or 2.

4. A single-event-effect tolerant SOI-based data latch circuit which is formed on a substrate having an SOI structure to provide a floating body structure and including a first inverter, a second inverter and a clocked inverter, wherein:

said first inverter has an output connected to an input of said second inverter;

said second inverter has an output connected to an input of said first inverter through a connection to be subject to on-off control based on first complementary clock signals having logic values complementary to each other; and said clocked inverter is operable to invert an received input and output said inverted input to the input of said first inverter under on-off control based on second complementary clock signals opposite in phase relative to said first complementary clock signals, wherein at least one of said first and second inverters consists of the single-event-effect tolerant SOI-based inverter as defined in claim 1 or 2.

5. The data latch circuit as defined in claim 4, wherein said clocked inverter includes a first p-channel MOS transistor, a second p-channel MOS transistor, a third p-channel MOS transistor, a first n-channel MOS transistor, a second n-channel MOS transistor and a third n-channel MOS transistor, which are connected in series with respect to a source or drain line in this order in a direction from a node connected to the side of the first voltage source to a node connected to the side of the second voltage source, wherein:

said second complementary clock signals are applied, respectively, to a first gate group consisting of respective gates of said first and third p-channel MOS transistors, and a second gate group consisting of said first and third n-channel MOS transistors;

each of said second p-channel MOS transistor and said second n-channel MOS transistor serves as an input section of said data latch circuit; and a node between said third p-channel MOS transistor and said first n-channel MOS transistor serves as an output section of said clocked inverter.

6. A single-event-effect tolerant SOI-based 2-input NAND element comprising: a pair of a first p-channel MOS transistor and a second p-channel MOS transistor which have channels connected in parallel with each other; and a pair of a first n-channel MOS transistor and a second n-channel MOS transistor which have channels connected in series with each other, wherein:

said p-channel MOS transistor pair and said n-channel MOS transistor pair are formed on a substrate having an SOI structure to provide a floating body structure, and connected in series in a direction from a node connected to the side of a first voltage source to a node connected to the side of a second voltage source;

respective gates of said first p-channel MOS transistor and said first n-channel MOS transistor are connected to a first input;

respective gates of said second p-channel MOS transistor and said second n-channel MOS transistor are connected to a second input; and a node between said p-channel MOS transistor pair and said n-channel MOS transistor pair is connected to an output, wherein each of said first p-channel MOS transistor, said second p-channel MOS transistor, said first n-channel MOS transistor and said second n-channel MOS transistor, is combined with an additional MOS transistor having a channel of the same conductive type as that thereof and a gate interconnected to a gate thereof, in such a manner that their channels are connected in series, so as to form a double structure.

7. The single-event-effect tolerant SOI-based 2-input NAND element as defined in claim 6, wherein said additional n-channel MOS transistors combined, respectively, with said first n-channel MOS transistor and said second n-channel MOS transistor through their series-connected channels for forming the double structure, are connected thereto except for a position between said first and second n-channel MOS transistors.

8. A single-event-effect tolerant SOI-based 3-input NAND element comprising: a group of a first p-channel MOS transistor, a second p-channel MOS transistor and a third p-channel MOS transistor which have channels connected in parallel with each other; and a group of a first n-channel MOS transistor a second n-channel MOS transistor and a third n-channel MOS transistor which have channels connected in series with each other, wherein:

said p-channel MOS transistor group and said n-channel MOS transistor group are formed on a substrate having an SOI structure, and connected in series in a direction from a node connected to the side of a first voltage source to a node connected to the side of a second voltage source;

respective gates of said first p-channel MOS transistor and said first n-channel MOS transistor are connected to a first input;

respective gates of said second p-channel MOS transistor and said second n-channel MOS transistor are connected to a second input;

respective gates of said third p-channel MOS transistor and said third n-channel MOS transistor are connected to a third input; and a node between said p-channel MOS transistor group and said n-channel MOS transistor group is connected to an output, wherein each of said first p-channel MOS transistor, said second p-channel MOS transistor, said third p-channel MOS transistor, said first n-channel MOS transistor, said second n-channel MOS transistor and said third n-channel MOS transistor, is combined with an additional MOS transistor having a channel of the same conductive type as that thereof and a gate interconnected to a gate thereof, in such a manner that their channels are connected in series, so as to form a double structure.

9. The single-event-effect tolerant SOI-based 3-input NAND element as defined in claim 8, wherein said additional n-channel MOS transistors combined, respectively, with said first n-channel MOS transistor, said second n-channel MOS transistor and said third n-channel MOS transistor through their series-connected channels for forming the double structure, are connected thereto except for a position between any two of said first, second and third n-channel MOS transistors.

10. A single-event-effect tolerant SOI-based 2-input NOR element comprising: a pair of a first p-channel MOS transistor and a second p-channel MOS transistor which have channels connected in series with each other; and a pair of a first n-channel MOS transistor and a second n-channel MOS transistor which have channels connected in parallel with each other, wherein:

said p-channel MOS transistor pair and said n-channel MOS transistor pair are formed on a substrate having an 501 structure to provide a floating body structure, and connected in series in a direction from a node connected to the side of a first voltage source to a node connected to the side of a second voltage source;

respective gates of said first p-channel MOS transistor and said first n-channel MOS transistor are connected to a first input;

respective gates of said second p-channel MOS transistor and said second n-channel MOS transistor are connected to a second input; and a node between said p-channel MOS transistor pair and said n-channel MOS transistor pair is connected to an output, wherein each of the first p-channel MOS transistor, the second p-channel MOS transistor, the first n-channel MOS transistor and the second n-channel MOS transistor, is combined with an additional MOS transistor having a channel of the same conductive type as that thereof and a gate interconnected to a gate thereof, in such a manner that their channels are connected in series, so as to form a double structure.

11. The single-event-effect tolerant SOI-based 2-input NOR element as defined in claim 10, wherein said additional p-channel MOS transistors combined, respectively, with said first p-channel MOS transistor and said second p-channel MOS transistor through their series-connected channels for forming the double structure, are connected thereto except for a position between said first and second p-channel MOS transistors.

12. A single-event-effect tolerant SOI-based 3-input NOR element comprising: a group of a first p-channel MOS transistor, a second p-channel MOS transistor and a third p-channel MOS transistor which have channels connected in series with each other; and a group of a first n-channel MOS transistor, a second n-channel MOS transistor and a third n-channel MOS transistor which have channels connected in parallel with each other, wherein:

said p-channel MOS transistor group and said n-channel MOS transistor group are formed on a substrate having an 501 structure to provide a floating body structure, and connected in series in a direction from a node connected to the side of a first voltage source to a node connected to the side of a second voltage source;

respective gates of said first p-channel MOS transistor and said first n-channel channel MOS transistor are connected to a first input;

respective gates of said second p-channel MOS transistor and said second n-channel MOS transistor are connected to a second input;

respective gates of said third p-channel MOS transistor and said third n-channel MOS transistor are connected to a third input; and a node between said p-channel MOS transistor group and said n-channel MOS transistor group is connected to an output, wherein each of the first p-channel MOS transistor, the second p-channel MOS transistor, the third p-channel MOS transistor, the first n-channel MOS transistor, the second n-channel MOS transistor and the third n-channel MOS transistor, is combined with an additional MOS transistor having a channel of the same conductive type as that thereof and a gate interconnected to a gate thereof, in such a manner that their channels are connected in series, so as to form a double structure.

13. The single-event-effect tolerant SOI-based 3-input NOR element as defined in claim 12, wherein said additional p-channel MOS transistors combined, respectively, with said first p-channel MOS transistor, said second p-channel MOS transistor and said third p-channel MOS transistor through their series-connected channels for forming the double structure, are connected thereto except for a position between any two of said first, second and third p-channel channel MOS transistors.

14. A single-event-effect tolerant SOI-based data latch circuit which is formed on a substrate having an SOI structure and including a first inverter, a second inverter and a clocked inverter, wherein:

said first inverter has an output connected to an input of said second inverter;

said second inverter has an output connected to an input of said first inverter; and said clocked inverter is operable to invert an received input and output said inverted input to the input of said first inverter under on-off control based on first complementary clock signals having logic values complementary to each other, wherein at least one of said first and second inverters is a single-event-effect tolerant SOI-based inverter comprising a first p-channel MOS transistor and a first n-channel MOS transistor, which are formed on a substrate having an SOI structure, and connected in series with respect to a source or drain line in this order in a direction from a node connected to the side of a first voltage source to a node connected to the side of a second voltage source, each of said first p-channel MOS transistor and said first n-channel MOS transistor being combined with a second MOS transistor having a channel of a same conductive type as that thereof and a gate interconnected to a gate thereof, in such a manner that they are connected in series with respect to the source or drain line, and respective nodes between said first and second p-channel MOS transistors and between said first and second n-channel MOS transistors are connected together, so as to formed a double structure, and at least one of said first and second inverters is a clocked inverter subject to on-off control based on second complementary clock signals opposite in phase relative to said first complementary clock signals.

* * * * *